United States Patent
Lamblin et al.

(10) Patent No.: US 7,680,670 B2
(45) Date of Patent: Mar. 16, 2010

(54) DIMENSIONAL VECTOR AND VARIABLE RESOLUTION QUANTIZATION

(75) Inventors: Claude Lamblin, Perros Guirec (FR);
David Virette, Pleumeur Bodou (FR);
Balazs Kovesi, Lannion (FR);
Dominique Massaloux, Perros Guirec (FR)

(73) Assignee: France Telecom, Paris (FR)

( * ) Notice: Subject to any disclaimer, the term of this patent is extended or adjusted under 35 U.S.C. 154(b) by 284 days.

(21) Appl. No.: 10/587,907

(22) PCT Filed: Jan. 30, 2004

(86) PCT No.: PCT/FR2004/000219

§ 371 (c)(1),
(2), (4) Date: Jul. 27, 2006

(87) PCT Pub. No.: WO2005/083889

PCT Pub. Date: Sep. 9, 2005

(65) Prior Publication Data

US 2007/0162236 A1    Jul. 12, 2007

(51) Int. Cl.
*G10L 19/00* (2006.01)
*G06K 9/00* (2006.01)
*H04N 7/26* (2006.01)

(52) U.S. Cl. ............... 704/500; 704/222; 704/E19.007; 382/253; 341/200

(58) Field of Classification Search .................. 704/500, 704/501, E19.017, E19.014, 222, E19.033; 375/240, 241
See application file for complete search history.

(56) References Cited

U.S. PATENT DOCUMENTS

| 4,922,535 | A | * | 5/1990 | Dolby | 704/500 |
| 4,969,192 | A | * | 11/1990 | Chen et al. | 704/222 |
| 5,182,773 | A | * | 1/1993 | Bahl et al. | 704/222 |
| 5,621,660 | A | * | 4/1997 | Chaddha et al. | 709/247 |
| 5,765,127 | A | * | 6/1998 | Nishiguchi et al. | 704/208 |
| 5,778,335 | A | * | 7/1998 | Ubale et al. | 704/219 |
| 5,809,459 | A | * | 9/1998 | Bergstrom et al. | 704/223 |
| 5,832,443 | A | * | 11/1998 | Kolesnik et al. | 704/500 |

(Continued)

FOREIGN PATENT DOCUMENTS

WO    WO 03/103151 A1    12/2003

OTHER PUBLICATIONS

A. Gersho, "Optimal nonlinear interpolative vector quantization," IEEE Trans. Commun., vol. 38, pp. 1285-1287, Sep. 1990.*

(Continued)

*Primary Examiner*—Talivaldis Ivars Smits
*Assistant Examiner*—Greg A Borsetti
(74) *Attorney, Agent, or Firm*—Drinker Biddle & Reath LLP

(57) ABSTRACT

The invention relates to compression coding and/or decoding of digital signals, in particular by vector variable-rate quantisation defining a variable resolution. For this purpose an impulsion dictionary comprises: for a given dimension, increasing resolution dictionaries imbricated into each other and, for a given dimension, a union of: a totality (D'i<N>) of code-vectors produced, by inserting elements taken in a final set (A) into smaller dimension code-vectors according to a final set of predetermined insertion rules (F1) and a second totality of code-vectors (Y') which are not obtainable by insertion into the smaller dimension code vectors according to said set of the insertion rules.

32 Claims, 10 Drawing Sheets

U.S. PATENT DOCUMENTS

| | | | | |
|---|---|---|---|---|
| 5,873,065 | A | * | 2/1999 | Akagiri et al. ............... 704/500 |
| 5,890,110 | A | * | 3/1999 | Gersho et al. ................ 704/222 |
| 6,018,707 | A | * | 1/2000 | Nishiguchi et al. ........... 704/222 |
| 6,098,037 | A | * | 8/2000 | Yeldener ..................... 704/221 |
| 6,141,638 | A | * | 10/2000 | Peng et al. ................... 704/211 |
| 6,421,467 | B1 | * | 7/2002 | Mitra .......................... 382/240 |
| 6,611,800 | B1 | * | 8/2003 | Nishiguchi et al. ........... 704/221 |
| 2001/0023396 | A1 | * | 9/2001 | Gersho et al. ................ 704/220 |
| 2004/0176950 | A1 | * | 9/2004 | Chu ............................ 704/207 |
| 2007/0067166 | A1 | * | 3/2007 | Pan et al. ..................... 704/222 |

OTHER PUBLICATIONS

A. Gersho and M. Yano, "Adaptive vector quantization by progressive codevector replacement," in Proc. IEEE Int. Conf. Acoust., Speech, Signal Processing, Mar. 1985, pp. 133-136.*

W.-Y. Chan and A. Gersho, "High fidelity audio transform coding with vector quantization," in Proc. ICASSP-90, May 1990, pp. 1109-1112.*

C. Erdmann, D. Bauer, and P. Vary, "Pyramid CELP: Embedded speech coding for packet communications," in Proc. IEEE Int. Conf. Acoustics, Speech, Signal Processing, 2002, pp. I-181-I-184.*

W.-Y. Chan and A. Gersho, "High fidelity audio transform coding with vector quantization," in Proc. ICASSP-90, May 1990, pp. 1109-1112.*

A. Gersho, "Optimal nonlinear interpolative vector quantization," IEEETrans. Commun., vol. 38, pp. 1285-1287, Sep. 1990.*

I. Kozintsev and K. Ramchandran, "Multiresolution joint source-channel coding using embedded constellations for power-constrained time-varying channels," in Proc. IEEE Int. Conf. Acoustics, Speech, Signal Processing, 1996, pp. 2345-2348.*

A. Singh and V. M. Bove, Jr., "Multidimensional Quantizers for Scalable Video Compression," IEEE Journal on Selected Areas in Communications, vol. 11, No. 1, pp. 36-45, Jan. 1993.*

M. Effros. Practical multi-resolution source coding: TSVQ revisited. In Proceed-ings of the Data Compression Conference, pp. 53-62, Snowbird, UT, Mar. 1998. IEEE.*

M Effros and D. Dugatkin, Multiresolution Vector Quantization, IEEE Trans. Information Theory, vol. 50, No. 1, p. 3130-3145, Dec. 2004.*

Jia Li, Navin Chaddha and Robert M. Gray, Multiresolution Tree Structured Vector Quantization, Proc. Asilomar Conference on Signals, Systems and Computers, Asilomar, California, Nov. 1996.*

Combescure et al., "A 16, 24, 32 Kbit/c Wideband Speech Codec Based on ATCELP," 1999 IEEE International Conference on Acoustics, Speech and Signal Processing, pp. 5-8, Phoenix, AZ, USA (Mar. 15, 1999).

Conway et al., "Fast Quantizing and Decoding Algorithms for Lattice Quantizers and Codes," IEEE Transactions on Information Theory, 28 (2), pp. 227-232, New York, IEEE, USA (Mar. 1982).

Lamblin et al., "Algorithme de Quantification Vectorielle Spherique a Partir du Reseau de Gosset D'Ordre 8," Annales Des Telecommunications, 43 (3/4), pp. 172-186, Les Moulineaus, France (Mar. 1, 1988).

Mahieux et al., "High-Quality Audio Transform Coding at 64 kbps," IEEE Trans. Comm., 42(11), pp. 3010-3019 (Nov. 1994).

Xie et al., "Embedded Algebraic Vector Quantizers (EAVQ) With Application to Wideband Speech Coding," 1996 IEEE International Conference on Acoustics, Speech, and Signal Processing, 1, pp. 240-243, New York, IEEE, USA (May 7, 1996).

* cited by examiner

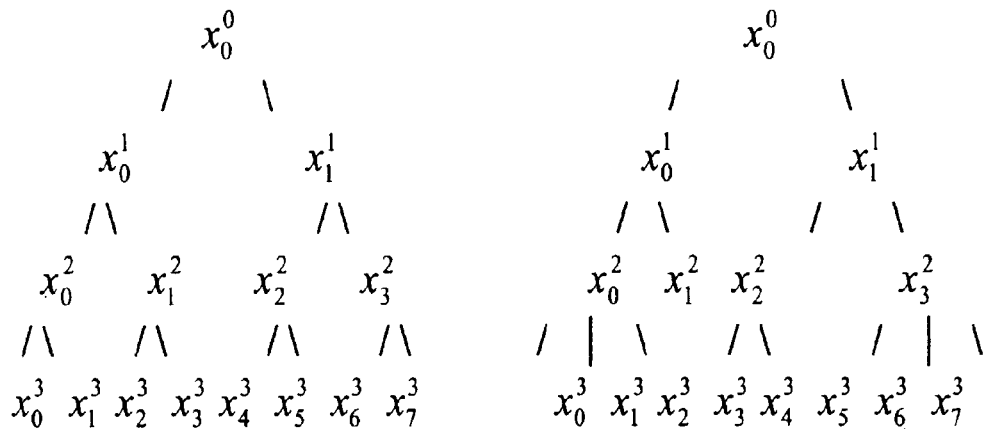
FIG. 1a
(PRIOR ART)
FIG. 1b
(PRIOR ART)
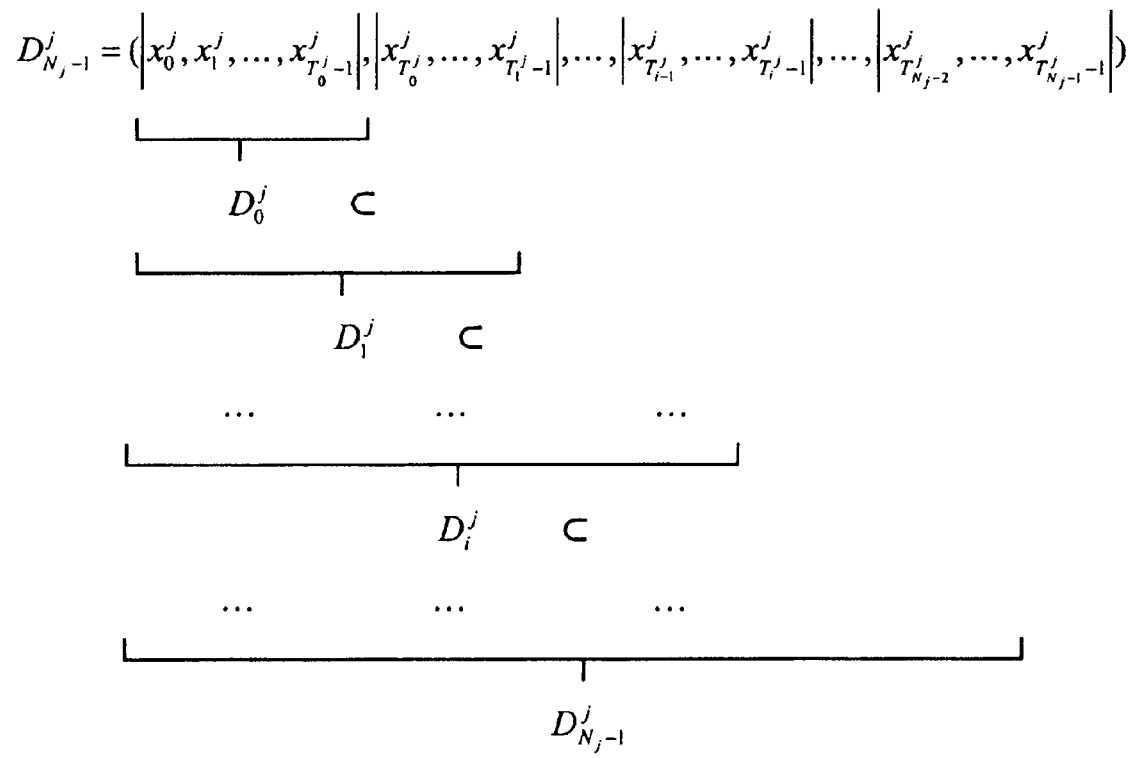
FIG. 3

| Band | Upper bound (Hz) | No. coefficients | Band | Upper bound (Hz) | No. coefficients |
|---|---|---|---|---|---|
| 0 | 75 | 3 | 16 | 2375 | 10 |
| 1 | 150 | 3 | 17 | 2625 | 10 |
| 2 | 225 | 3 | 18 | 2875 | 10 |
| 3 | 300 | 3 | 19 | 3175 | 12 |
| 4 | 375 | 3 | 20 | 3475 | 12 |
| 5 | 475 | 4 | 21 | 3775 | 12 |
| 6 | 575 | 4 | 22 | 4075 | 12 |
| 7 | 675 | 4 | 23 | 4400 | 13 |
| 8 | 800 | 5 | 24 | 4725 | 13 |
| 9 | 925 | 5 | 25 | 5050 | 13 |
| 10 | 1050 | 5 | 26 | 5400 | 14 |
| 11 | 1225 | 7 | 27 | 5750 | 14 |
| 12 | 1425 | 8 | 28 | 6100 | 14 |
| 13 | 1650 | 9 | 29 | 6475 | 15 |
| 14 | 1875 | 9 | 30 | 6850 | 15 |
| 15 | 2125 | 10 | 31 | 7225 | 15 |

| j | $N_j$ | Rate per band $\{jr_0^j, jr_1^j, ..., jr_i^j, ..., jr_{N_j-1}^j\}$ |
|---|---|---|
| 1 | 1 | 1 |
| 2 | 5 | 2, 3, 4, 5, 6 |
| 3 | 8 | 3, 4, 5, 6, 7, 8, 9, 10 |
| 4 | 10 | 3, 5, 6, 7, 8, 9, 10, 11, 12, 13 |
| 5 | 13 | 4, 6, 7, 8, 9, 10, 11, 12, 13, 14, 15, 16, 17 |
| 6 | 15 | 4, 7, 8, 9, 10, 11, 12, 13, 14, 15, 16, 17, 18, 19, 20 |
| 7 | 18 | 4, 7, 8, 9, 10, 11, 12, 13, 14, 15, 16, 17, 18, 19, 20, 21, 22, 23 |
| 8 | 20 | 4, 7, 9, 10, 11, 12, 13, 14, 15, 16, 17, 18, 19, 20, 21, 22, 23, 24, 25, 26 |
| 9 | 23 | 5, 8, 9, 10, 11, 12, 13, 14, 15, 16, 17, 18, 19, 20, 21, 22, 23, 24, 25, 26, 27, 28, 29 |
| 10 | 25 | 5, 8, 10, 11, 12, 13, 14, 15, 16, 17, 18, 19, 20, 21, 22, 23, 24, 25, 26, 27, 28, 29, 30, 31, 32 |
| 11 | 25 | 5, 8, 10, 11, 12, 13, 14, 15, 16, 17, 18, 19, 20, 21, 22, 23, 24, 25, 26, 27, 28, 29, 30, 31, 32 |
| 12 | 25 | 5, 9, 10, 11, 12, 13, 14, 15, 16, 17, 18, 19, 20, 21, 22, 23, 24, 25, 26, 27, 28, 29, 30, 31, 32 |
| 13 | 25 | 5, 9, 10, 11, 12, 13, 14, 15, 16, 17, 18, 19, 20, 21, 22, 23, 24, 25, 26, 27, 28, 29, 30, 31, 32 |
| 14 | 24 | 5, 9, 11, 12, 13, 14, 15, 16, 17, 18, 19, 20, 21, 22, 23, 24, 25, 26, 27, 28, 29, 30, 31, 32 |
| 15 | 24 | 5, 9, 11, 12, 13, 14, 15, 16, 17, 18, 19, 20, 21, 22, 23, 24, 25, 26, 27, 28, 29, 30, 31, 32 |

FIG. 7e

| j | $N_j$ | $\sum_{i=1}^{N_j} L_{D_i^j}$ | $j\sum_{i=1}^{N_j} L_{D_i^j}$ | $\sum_{k=1}^{j} k \sum_{i=1}^{N_k} L_{D_i^k}$ | $L_j$ | $\sum_{k=1}^{j} kL_k$ | $\sum_{k=1}^{j} kL_k / \sum_{k=1}^{j} k \sum_{i=1}^{N_k} L_{D_i^k}$ |
|---|---|---|---|---|---|---|---|
| 1 | 1 | 1 | 1 | 1 | 1 | 1 | 1 |
| 2 | 5 | 18 | 36 | 37 | 6 | 13 | 0,351 |
| 3 | 8 | 71 | 213 | 250 | 16 | 61 | 0,244 |
| 4 | 10 | 166 | 664 | 914 | 27 | 169 | 0,185 |
| 5 | 13 | 418 | 2090 | 3004 | 48 | 409 | 0,136 |
| 6 | 15 | 695 | 4170 | 7174 | 48 | 697 | 0,097 |
| 7 | 18 | 1095 | 7665 | 14839 | 63 | 1138 | 0,077 |
| 8 | 20 | 1620 | 12960 | 27799 | 72 | 1714 | 0,062 |
| 9 | 23 | 2251 | 20259 | 48058 | 73 | 2371 | 0,049 |
| 10 | 25 | 3057 | 30570 | 78628 | 83 | 3201 | 0,041 |
| 11 | 25 | 2447 | 26917 | 105545 | 10 | 3311 | 0,031 |
| 12 | 25 | 2101 | 25212 | 130757 | 33 | 3707 | 0,028 |
| 13 | 25 | 1826 | 23738 | 154495 | 19 | 3954 | 0,026 |
| 14 | 24 | 1608 | 22512 | 177007 | 10 | 4094 | 0,023 |
| 15 | 24 | 1447 | 21705 | 198712 | 7 | 4199 | 0,021 |

| j | $N_j$ | $\sum_{i=1}^{N_j-1} L_{D_i^j}$ | $j\sum_{i=1}^{N_j-1} L_{D_i^j}$ | $L_{D^j}$ | $jL_{D^j}$ | $jL_{D^j}/j\sum_{i=1}^{N_j-1} L_{D_i^j}$ |
|---|---|---|---|---|---|---|
| 1 | 1 | 1 | 1 | 1 | 1 | 1.00 |
| 2 | 5 | 18 | 36 | 7 | 14 | 0.39 |
| 3 | 8 | 71 | 213 | 23 | 69 | 0.32 |
| 4 | 10 | 166 | 664 | 50 | 200 | 0.30 |
| 5 | 13 | 418 | 2090 | 98 | 490 | 0.23 |
| 6 | 15 | 695 | 4170 | 146 | 876 | 0.21 |
| 7 | 18 | 1095 | 7665 | 209 | 1463 | 0.19 |
| 8 | 20 | 1620 | 12960 | 281 | 2248 | 0.17 |
| 9 | 23 | 2251 | 20259 | 354 | 3186 | 0.16 |
| 10 | 25 | 3057 | 30570 | 437 | 4370 | 0.14 |
| 11 | 25 | 2447 | 26917 | 369 | 4059 | 0.15 |
| 12 | 25 | 2101 | 25212 | 321 | 3852 | 0.15 |
| 13 | 25 | 1826 | 23738 | 268 | 3484 | 0.15 |
| 14 | 24 | 1608 | 22512 | 233 | 3262 | 0.14 |
| 15 | 24 | 1447 | 21705 | 205 | 3075 | 0.14 |

FIG. 7c

| j | $L_{D^j}$ | $\sum_{k=1}^{j} L_{D^k}$ | $\sum_{k=1}^{j} kL_{D^k}$ | $L_{rj}$ | $\sum_{k=j}^{j} L_k$ | $\sum_{k=1}^{j} kL_k$ | $\sum_{k=1}^{j} kL_k / \sum_{k=1}^{j} kL_{D^k}$ |
|---|---|---|---|---|---|---|---|
| 1 | 1 | 1 | 1 | 1 | 1 | 1 | 1.00 |
| 2 | 7 | 8 | 15 | 6 | 7 | 13 | 0.87 |
| 3 | 23 | 31 | 84 | 16 | 23 | 61 | 0.73 |
| 4 | 50 | 81 | 284 | 27 | 50 | 169 | 0.60 |
| 5 | 98 | 179 | 774 | 48 | 98 | 409 | 0.53 |
| 6 | 146 | 325 | 1650 | 48 | 146 | 697 | 0.42 |
| 7 | 209 | 534 | 3113 | 63 | 209 | 1138 | 0.37 |
| 8 | 281 | 815 | 5361 | 72 | 281 | 1714 | 0.32 |
| 9 | 354 | 1169 | 8547 | 73 | 354 | 2371 | 0.28 |
| 10 | 437 | 1606 | 12917 | 83 | 437 | 3201 | 0.25 |
| 11 | 369 | 1975 | 16976 | 10 | 447 | 3311 | 0.20 |
| 12 | 321 | 2296 | 20828 | 33 | 480 | 3707 | 0.18 |
| 13 | 268 | 2564 | 24312 | 19 | 499 | 3954 | 0.16 |
| 14 | 233 | 2797 | 27574 | 10 | 509 | 4094 | 0.15 |
| 15 | 205 | 3002 | 30649 | 7 | 516 | 4199 | 0.14 |

FIG. 7d

| l | j | l' | Leader | l | j | l' | Leader |
|---|---|----|--------|---|---|----|--------|
| 0 | 1 | 0 | 1 | 12 | 3 | 5 | 4 1 1 |
| 1 | 2 | 0 | 1 1 | 13 | 3 | 6 | 4 4 1 |
| 2 | 2 | 1 | 2 1 | 14 | 3 | 7 | 5 1 1 |
| 3 | 2 | 2 | 3 1 | 15 | 3 | 8 | 6 1 1 |
| 4 | 2 | 3 | 4 1 | 16 | 3 | 9 | 3 2 1 |
| 5 | 2 | 4 | 5 1 | 17 | 3 | 10 | 4 2 1 |
| 6 | 2 | 5 | 9 1 | 18 | 3 | 11 | 4 3 1 |
| 7 | 3 | 0 | 1 1 1 | 19 | 3 | 12 | 5 2 1 |
| 8 | 3 | 1 | 2 1 1 | 20 | 3 | 13 | 5 4 1 |
| 9 | 3 | 2 | 2 2 1 | 21 | 3 | 14 | 7 3 1 |
| 10 | 3 | 3 | 3 1 1 | 22 | 3 | 15 | 8 2 1 |
| 11 | 3 | 4 | 3 3 1 | | | | |

FIG. 7f

| $m^3$ | i | $jr_i$ | leader $x^3$ | j' | $x^{j'}$ | $l_m$ | $m^3$ | i | $jr_i$ | leader $x^3$ | j' | $x^{j'}$ | $l_m$ |
|---|---|---|---|---|---|---|---|---|---|---|---|---|---|
| 0 | 0 | 3 | 1 0 0 | 1 | 1 | 0 | 12 | 6 | 9 | 4 1 1 | 3 | 4 1 1 | 12 |
| 1 | 1 | 4 | 1 1 1 | 3 | 1 1 1 | 7 | 13 | 6 | 9 | 4 4 1 | 3 | 4 4 1 | 13 |
| 2 | 2 | 5 | 1 1 0 | 2 | 1 1 | 1 | 14 | 6 | 9 | 5 1 1 | 3 | 5 1 1 | 14 |
| 3 | 3 | 6 | 3 1 0 | 2 | 3 1 | 3 | 15 | 6 | 9 | 6 1 1 | 3 | 6 1 1 | 15 |
| 4 | 4 | 7 | 4 1 0 | 2 | 4 1 | 4 | 16 | 6 | 9 | 3 2 1 | 3 | 3 2 1 | 16 |
| 5 | 4 | 7 | 5 1 0 | 2 | 5 1 | 5 | 17 | 6 | 9 | 4 2 1 | 3 | 4 2 1 | 17 |
| 6 | 4 | 7 | 9 1 0 | 2 | 9 1 | 6 | 18 | 6 | 9 | 4 3 1 | 3 | 4 3 1 | 18 |
| 7 | 5 | 8 | 2 1 0 | 2 | 2 1 | 2 | 19 | 7 | 10 | 5 2 1 | 3 | 5 2 1 | 19 |
| 8 | 5 | 8 | 2 1 1 | 3 | 2 1 1 | 8 | 20 | 7 | 10 | 5 4 1 | 3 | 5 4 1 | 20 |
| 9 | 5 | 8 | 2 2 1 | 3 | 2 2 1 | 9 | 21 | 7 | 10 | 7 3 1 | 3 | 7 3 1 | 21 |
| 10 | 5 | 8 | 3 1 1 | 3 | 3 1 1 | 10 | 22 | 7 | 10 | 8 2 1 | 3 | 8 2 1 | 22 |
| 11 | 5 | 8 | 3 3 1 | 3 | 3 3 1 | 11 | | | | | | | |

FIG. 7g

| Band | Upper bound (Hz) | No. coefficients | Band | Upper bound (Hz) | No. coefficients | Band | Upper bound (Hz) | No. coefficients |
|---|---|---|---|---|---|---|---|---|
| 0 | 75 | 3 | 18 | 2875 | 10 | 35 | 8725 | 15 |
| 1 | 150 | 3 | 19 | 3175 | 12 | 36 | 9100 | 15 |
| 2 | 225 | 3 | 20 | 3475 | 12 | 37 | 9500 | 16 |
| 3 | 300 | 3 | 21 | 3775 | 12 | 38 | 9900 | 16 |
| 4 | 375 | 3 | 22 | 4075 | 12 | 39 | 10300 | 16 |
| 5 | 475 | 4 | 23 | 4400 | 13 | 40 | 10700 | 16 |
| 6 | 575 | 4 | 24 | 4725 | 13 | 41 | 11125 | 17 |
| 7 | 675 | 4 | 25 | 5050 | 13 | 42 | 11575 | 18 |
| 8 | 800 | 5 | 26 | 5400 | 14 | 43 | 12025 | 18 |
| 9 | 925 | 5 | 27 | 5750 | 14 | 44 | 12475 | 18 |
| 10 | 1050 | 5 | 28 | 6100 | 14 | 45 | 12925 | 18 |
| 11 | 1225 | 7 | 29 | 6475 | 15 | 46 | 13400 | 19 |
| 12 | 1425 | 8 | 30 | 6850 | 15 | 47 | 13900 | 20 |
| 13 | 1650 | 9 | 31 | 7225 | 15 | 48 | 14400 | 20 |
| 14 | 1875 | 9 | 32 | 7600 | 15 | 49 | 14900 | 20 |
| 15 | 2125 | 10 | 33 | 7975 | 15 | 50 | 15400 | 20 |
| 16 | 2375 | 10 | 34 | 8350 | 15 | 51 | 16000 | 24 |
| 17 | 2625 | 10 | | | | | | |

FIG. 8a

| j | $N_j$ | $\{jr_0^j, jr_1^j, ... jr_l^j, ... jr_{N_j-1}^j\}$ |
|---|---|---|
| 1 | 1 | 1 |
| 2 | 5 | 2, 3, 4, 5, 6 |
| 3 | 8 | 3, 4, 5, 6, 7, 8, 9, 10 |
| 4 | 10 | 3, 5, 6, 7, 8, 9, 10, 11, 12, 13 |
| 5 | 13 | 4, 6, 7, 8, 9, 10, 11, 12, 13, 14, 15, 16, 17 |
| 6 | 15 | 4, 7, 8, 9, 10, 11, 12, 13, 14, 15, 16, 17, 18, 19, 20 |
| 7 | 18 | 4, 7, 8, 9, 10, 11, 12, 13, 14, 15, 16, 17, 18, 19, 20, 21, 22, 23 |
| 8 | 20 | 4, 7, 9, 10, 11, 12, 13, 14, 15, 16, 17, 18, 19, 20, 21, 22, 23, 24, 25, 26 |
| 9 | 23 | 5, 8, 9, 10, 11, 12, 13, 14, 15, 16, 17, 18, 19, 20, 21, 22, 23, 24, 25, 26, 27, 28, 29 |
| 10 | 25 | 5, 8, 10, 11, 12, 13, 14, 15, 16, 17, 18, 19, 20, 21, 22, 23, 24, 25, 26, 27, 28, 29, 30, 31, 32 |
| 11 | 25 | 5, 8, 10, 11, 12, 13, 14, 15, 16, 17, 18, 19, 20, 21, 22, 23, 24, 25, 26, 27, 28, 29, 30, 31, 32 |
| 12 | 25 | 5, 9, 10, 11, 12, 13, 14, 15, 16, 17, 18, 19, 20, 21, 22, 23, 24, 25, 26, 27, 28, 29, 30, 31, 32 |
| 13 | 25 | 5, 9, 10, 11, 12, 13, 14, 15, 16, 17, 18, 19, 20, 21, 22, 23, 24, 25, 26, 27, 28, 29, 30, 31, 32 |
| 14 | 24 | 5, 9, 11, 12, 13, 14, 15, 16, 17, 18, 19, 20, 21, 22, 23, 24, 25, 26, 27, 28, 29, 30, 31, 32 |
| 15 | 24 | 5, 9, 11, 12, 13, 14, 15, 16, 17, 18, 19, 20, 21, 22, 23, 24, 25, 26, 27, 28, 29, 30, 31, 32 |
| 16 | 23 | 9, 11, 12, 13, 14, 15, 16, 17, 18, 19, 20, 21, 22, 23, 24, 25, 26, 27, 28, 29, 30, 31, 31 |
| 17 | 23 | 10, 11, 12, 13, 14, 15, 16, 17, 18, 19, 20, 21, 22, 23, 24, 25, 26, 27, 28, 29, 30, 31, 31 |
| 18 | 23 | 10, 11, 12, 13, 14, 15, 16, 17, 18, 19, 20, 21, 22, 23, 24, 25, 26, 27, 28, 29, 30, 31, 31 |
| 19 | 23 | 10, 11, 12, 13, 14, 15, 16, 17, 18, 19, 20, 21, 22, 23, 24, 25, 26, 27, 28, 29, 30, 31, 31 |
| 20 | 23 | 10, 11, 12, 13, 14, 15, 16, 17, 18, 19, 20, 21, 22, 23, 24, 25, 26, 27, 28, 29, 30, 31, 31 |
| 21 | 0 | ∅ |
| 22 | 0 | ∅ |
| 23 | 0 | ∅ |
| 24 | 24 | 9, 10, 11, 12, 13, 14, 15, 16, 17, 18, 19, 20, 21, 22, 23, 24, 25, 26, 27, 28, 29, 30, 31, 31 |

FIG. 8b

DIMENSIONAL VECTOR AND VARIABLE RESOLUTION QUANTIZATION

CROSS-REFERENCE TO RELATED APPLICATIONS

This application is the U.S. national phase of the International Patent Application No. PCT/FR2004/000219 filed Jan. 30, 2004, the entire content of which is incorporated herein by reference.

FIELD OF THE INVENTION

The present invention relates to the compression coding and/or decoding of digital signals such as audio, video signals, and more generally multimedia signals for their storage and/or their transmission.

BACKGROUND OF THE INVENTION

A very widespread solution in the compression of digital signals is vector quantization. A first incentive to use vector quantization may be found in block coding theory developed by Shannon according to which better performance may be achieved by boosting the dimension of the vectors to be coded. Vector quantization consists in representing an input vector by a vector of like dimension chosen from a finite set. Thus, providing a quantizer with M levels (or codevectors) amounts to creating a non-bijective mapping from the set of input vectors (generally the Euclidian real space with n dimensions $R^n$, or else a subset of $R^n$) into a finite subset Y of $R^n$. The subset Y then comprises M distinct elements:

$$Y = \{y_1, y_2, \ldots y_M\}.$$

Y is called the reproduction alphabet, or else dictionary, or else directory. The elements of Y are called "codevectors", "code words", "exit points", or else "representatives".

The rate per dimension (r) of the quantizer (or else its "resolution") is defined by:

$$r = \frac{1}{n} \log_2 M$$

In vector quantization, a block of n samples is processed as a vector of dimension n. The vector is coded by choosing a codevector, from a dictionary of M codevectors, the one which most "resembles" it. In general, an exhaustive search is made among all the elements of the dictionary to select the element of the dictionary which minimizes a measure of distance between it and the input vector.

According to the theory of source coding, when the dimension becomes too large, the performance of the vector quantization approaches a limit termed the "bound of rate-distortion of the source". Apart from the dimensionality of the space, vector quantization may also utilize the properties of the source to be coded, for example nonlinear and/or linear dependencies, or else the shape of the probability distribution. In general, the dictionaries of vector quantizers are designed on the basis of statistical procedures such as the generalized Lloyd algorithm (denoted GLA). This algorithm, well known, is based on the necessary conditions of optimality of a vector quantization. On the basis of a training sequence representative of the source to be coded and of an initial dictionary, the dictionary is constructed iteratively. Each iteration comprises two steps:
  the construction of the regions of quantization by quantization of the training sequence according to the rule of the nearest neighbour, and
  the improving of the dictionary by replacing the old codevectors by the centroids of the regions (according to the rule of centroids).

To avoid the convergence to a local minimum of this deterministic iterative algorithm, variants termed "stochastic relaxation" (denoted SKA standing for "Stochastic K-means algorithm") inspired by the technique of simulated annealing have been proposed by introducing a randomness into the step of constructing the centroids and/or into that of constructing the classes. The statistical vector quantizers thus obtained do not possess any structure, thereby rendering their exploration expensive in terms of calculations and memory greedy. Specifically, the complexity both of the coding and of the storage, is proportional to $n.2^{nr}$. This exponential increase as a function of the dimension of the vectors and of the rate limits the use of unstructured vector quantizers to small dimensions and/or low rates so as to be able to implant them in real time.

Scalar quantization, which quantizes the samples individually, is not as effective as vector quantization since it can utilize only the shape of the probability distribution of the source and the linear dependency. However, scalar quantization is less expensive in terms of calculations and memory than vector quantization. Moreover, scalar quantization associated with entropy coding can achieve good performance even at moderate resolutions.

To circumvent the constraints of size and of dimension, several variants of the basic vector quantization were studied, they attempt to remedy the absence of structure of the dictionary and thus succeed in reducing the complexity to the detriment of quality. However, the performance/complexity compromise is improved, thereby making it possible to increase the span of resolutions and/or of dimensions to which the vector quantization may be applied effectively in terms of cost of calculations or of memory.

Numerous schemes of structured vector quantizers have been proposed in the literature. The main ones are the following:
  the tree vector quantizer which imposes a hierarchical tree structure on the dictionary: the search procedure is simplified but the quantizer requires more storage memory,
  the multi stage vector quantizer which cascades vector quantizers of lesser levels: the dictionaries are of reduced sizes and the same goes as regards the calculation time and the memory cost,
  the vector quantizer termed the "Cartesian product" of N classical vector quantizers of smaller dimensions and sizes: the input vector is decomposed into N subvectors, each subvector being quantized independently of the others,
  the "gain/orientation" vector quantizer constitutes a particular case of the "Cartesian product" vector quantizer: two quantizers are provided, one a scalar quantizer and the other a vector quantizer, which code separately, independently or otherwise, the gain (or the norm) of the vector and its orientation (by considering the normalized input vector). This type of vector quantization is also called "spherical" vector quantization or "polar" vector quantization,
  the "permutation code" vector quantizer, whose codevectors are obtained by permutations of the components of a leader vector and its generalization to the composite (or the union) of permutation codes.

The techniques described above all come within a statistical approach.

Another radically different approach has also been proposed. This is algebraic vector quantization, which uses highly structured dictionaries, arising from regular lattices of points or error corrector codes. By virtue of the algebraic properties of their dictionaries, algebraic vector quantizers are simple to implement and do not have to be stored in memory. The utilization of the regular structure of these dictionaries actually allows the development of optimal and fast search algorithms and of mechanisms for associating in particular an index with a corresponding codevector (for example through a formula). Algebraic vector quantizers are less complex to implement and require less memory. However, they are optimal only for a uniform distribution of the source (either in space, or on the surface of a hypersphere). Being a generalization of the uniform scalar quantizer, the algebraic vector quantizer is more difficult to tailor to the distribution of the source through the so-called "companding" technique. It is also recalled that the indexation (or numbering) of the codevectors and the inverse operation (decoding) require more calculations than in the case of statistical vector quantizers, for which these operations are performed by simple readings from a table.

Certain aspects of a variable-dimension quantization and the problems encountered are presented hereinbelow.

It is firstly indicated that vector quantization is a well known and effective technique for coding blocks of samples of fixed length. However, in numerous applications of digital signal compression, the signal to be coded is modelled by a sequence of parameters of variable length. Effective compression of these vectors of variable dimension is crucial for the design of many multimedia coders such as speech or audio coders ("MBE" coder, harmonic coder, sinusoidal coder, transform based coder, coder based on interpolation of prototype waveforms).

In sinusoidal coders, the number of sinusoids extracted depends on the number of sinusoidal spikes detected in the signal, which number varies in the course of time as a function of the nature of the audio signal.

Furthermore, numerous techniques of speech compression utilize the long-term periodicity of the signal. Such is the case for harmonic coders where the spectral components of a set of frequencies, which are the harmonics of the fundamental period of the talker, are coded. The number of spectral harmonic spikes being inversely proportional to the fundamental frequency, as this fundamental period varies according to the talker (typically, children having a higher frequency of vibration of the vocal cords than men) and over time, the number of components to be quantized also changes over time from frame to frame.

Such is also the case for PWI coders (standing for "Prototype Waveform Interpolation") where the prototype waveforms are extracted over segments of length equal to the period of the pitch, hence also temporally variable. In PWI coders, the quantization of these waveforms of variable length is effected by separately coding the gain (or "RMS" standing for "Root-Mean-Square") and the normalized waveform which is itself decomposed into two waveforms of the same variable length: the REW waveform ("Rapidly Evolving Waveform") and the SEW waveform ("Slowly Evolving Waveform"). For a frame of fixed length, the number of prototypes is variable, hence the number of gains, of REW and SEW is likewise variable, as is the dimension of the REW and SEW waveforms.

In other types of coders, such as transform-based audio coders, the number of transform coefficients obtained over fixed-length frame lengths is imposed but it is usual to group these coefficients into frequency bands for their quantization. Conventionally, this splitting is performed into bands of unequal widths so as to utilize the psychoacoustic properties of human hearing by following the critical bands of the ear. The span of variation of the dimension of these vectors of transform coefficients typically varies from 3 (for the lower frequency bands) to 15 (for the high frequency bands), in a wideband coder (50 Hz-7000 Hz), and even up to 24 in an FM band coder (covering the 20 Hz-16000 Hz audible range).

Thoeretically, an optimal vector quantizer of variable dimension would utilize a set of dictionaries of fixed dimension, one for each possible dimension of the input vector. For example, in harmonic coders, for a pitch period of 60 to 450 Hz, the number of harmonic spikes in the telephone band varying from 7 for high-pitched voices (children) to 52 for low-pitched voices (men), it would be necessary to construct, place in memory and implement 46 (46=52−7) vector quantizers. The design of each dictionary requires a learning sequence long enough to correctly represent the statistics of the input vectors. Moreover, the storage of all the dictionaries turns out to be impractical or very expensive in memory. It is therefore seen that in the case of variable dimension, it is difficult to harness the advantages of vector quantization while complying with the constraints of memory storage and also of training sequences.

Presented hereinbelow are certain aspects of a quantization with variable resolution and the problems encountered.

It is pointed out firstly that the variability of the input signal is not manifested solely through the variation in the number of parameters to be coded but also through the variation in the quantity of binary information to be transmitted for a given quality. For example in speech, onsets, voiced sounds and unvoiced sounds do not require the same rate for one and the same quality. Relatively unpredictable onsets require a higher rate than voiced sounds that are more stable and whose stationarity may be exploited by "predictors" which make it possible to reduce the rate. Finally, the unvoiced sounds do not require high coding precision and hence need little rate.

To utilize the temporal variation of the characteristics of multimedia signals such as voice or video, it is judicious to design variable rate coders. These variable rate coders are especially suited to communications over lattices, packet-wise, such as the Internet, ATM, or others.

Specifically, packet switching makes it possible to handle and process the information bits in a more flexible manner and hence to increase the capacity of the channel by reducing the mean rate. The use of variable rate coders is also an effective means of combating congestion of the system and/or of accommodating the diversity of access conditions.

In multimedia communications, variable rate quantizers also make it possible to optimize the distributing of the rate between:

- the source and channel codings: as in the concept of AMR ("Adaptive Multi Rate"), the rate can be switched on each 20-ms frame so as to be adapted dynamically to the traffic and channel error conditions. The overall quality of the speech is thus improved by ensuring good protection against errors, while reducing the rate for the coding of the source if the channel degrades;
- the various types of media signals (such as voice and video in video conferencing applications);
- the various parameters of one and the same signal: in transform based audio coders, for example, it is usual to distribute the bits dynamically between the spectral envelope and the various bands of coefficients. Often, an entropy coding of the envelope is firstly performed and its objective is to utilize the nonuniform distribution of the code words by assigning variable length codes to the code words, the most probable ones having a shorter length than the least probable ones, thereby leading to the minimization of the mean length of the code words. Moreover, to utilize the psychoacoustic properties of the human ear, the remaining (variable) rate is allotted dynamically to the frequency bands of the coefficients as a function of their perceptual significance.

New applications of multimedia coding (such as audio and video) require highly flexible quantizations both as regards dimension and rate. The range of rates having moreover to make it possible to achieve high quality, these multidimensional and multiresolution quantizers must be aimed at high resolutions. The complexity barrier posed by these vector quantizers remains, per se, a performance to be achieved, despite the increase in processing powers and memory capacities of the new technologies.

As will be seen hereinbelow, most of the source coding techniques proposed are aimed either at solving the problems related to a variable dimension, or the problems related to a variable resolution. Few techniques proposed today make it possible to solve these two problems jointly.

As regards vector quantization with variable dimension, known, the variability of the dimension of the parameters to be coded constitutes per se an obstacle to the use of vector quantization. Thus, the first versions of the transform based coder employ Lloyd-Max scalar quantizers. A coder of this type, termed "TDAC", developed by the Applicant, is described in particular in:

"High Quality Audio Transform Coding at 64 kbit/s", by Y. Mahieux, J. P. Petit, in IEEE Trans. Commun, Vol. 42, No 11, pp. 3010-3019, November 1994.

Other solutions have been proposed to solve this problem of variable dimension vector quantization. The "IMBE" coder uses a complicated coding scheme with variable binary allocations and a scalar/vector hybrid quantization.

An approach very commonly used to quantize vectors of variable dimension consists in pre-processing the vector of variable dimension so as to convert it into another vector of fixed dimension before quantization. There are several variants of this vector quantization technique associated with dimension conversion (this type of vector quantization being denoted DCVQ standing for "Dimension Conversion Vector Quantization").

Among the various dimension conversion procedures proposed, mention may in particular be made of: truncation, subsampling, interpolation, "length warping".

For sinusoidal speech coders or MBEs, it has been proposed that the spectral coefficients be approximated by an all-pole model of fixed order and then a vector quantization of fixed dimension of the parameters of the model be performed. Another technique of vector quantization by nonsquare matrix transform solves the problem of vector quantization of variable dimension L by combining a vector quantization of fixed dimension K (K<L) with a nonsquare matrix linear transform (L×K).

There is also another type of vector quantization associated with a dimension conversion which still uses a vector quantizer of fixed dimension K but the dimension conversion is applied to the codevectors to obtain codevectors having the same dimension as the input vector.

The drawback of vector quantization associated with a dimension conversion is that the total distortion has two components: one due to the quantization, the other to the dimension conversion. To avoid this distortion due to dimension conversion, another approach of vector quantization of variable dimension consists in considering each input vector of variable dimension L as formed of a subset of components of an "underlying" vector of dimension K (L<K) and in designing and using just a single "universal" dictionary of fixed dimension K which nevertheless covers the entire span of dimensions of the input vectors, the correspondence between the input vector being effected by a selector. However, this "universal" dictionary encompassing all the other dictionaries of lower dimensions does not appear to be optimal for the lowest dimensions. In particular, the maximum resolution $r_{max}$ per dimension is limited by the storage constraint and by the rate per vector of parameters. For a dictionary of size $2^{Krmax}$, the quantity of memory required to store this dictionary is $K2^{Krmax}$ values and its rate per vector of parameters is $Kr_{max}$. Thus, for one and the same size of dictionary (and hence one and the same rate per vector of parameters and per frame), a vector of dimension L (L<K) could have a resolution (or a rate per dimension) K/L times larger, and this for K/L times smaller a volume of information to be stored.

As regards vector quantization with variable resolution, known, a simple solution consists in, as for the case of vector quantization with variable dimension, using a scalar quantization, as for example in the first versions of the TDAC transform based coder.

However, the use of an integer resolution per sample entails a coarse granularity of resolution per band of coefficients which hinders the effectiveness of the dynamic binary allocation procedure. Thus the use has been proposed of scalar quantizers with an odd integer number of reconstruction levels, in combination with a procedure for arranging the coded indices as a joint binary train. The finer granularity of the resolution afforded, more propitious for the binary allocation procedure, has made it possible to improve the quality, at the price of the complexity of the algorithm for combining the indices, this algorithm being necessary for the arrangement into a binary train to be effective in terms of rate. Nevertheless, for elevated frequency bands having a larger number of coefficients, the constraint of an integer number of levels per sample, due to the scalar quantization, is still manifested through too coarse a granularity of the resolutions per band.

Vector quantization make it possible to circumvent this constraint of a number of integer levels per sample and permits fine granularity of the resolutions available. On the other hand, the complexity of the vector quantization often limits the number of available rates. For example, the AMR-NB multirate speech coder, based on the well known ACELP technique, comprises eight fixed rates ranging from 12.2 kbit/s to 4.75 kbit/s, each having a different level of protection against errors by virtue of a different distribution of the rate between the source coding and the channel coding. For each of the parameters of the ACELP coder (LSP, LTP delayers, excitation gains, fixed excitation), dictionaries of different resolution have been constructed. However, the number of available rates for each of these parameters is limited by the complexity of storage of the nonalgebraic vector quantizers. Moreover, in the AMR-WB multirate coder comprising nine rates ranging from 6.60 to 23.85 kbit/s, the variation in the rates is essentially ensured by the algebraic excitation dictionaries which require no storage. There are eight dictionaries and therefore eight rates for the fixed excitation while the other parameters which use stochastic dictionaries (LSP, gains, absolute and differential delays) have only two possible rates.

It is indicated that the stochastic vector quantizers used in AMR multirate coders are vector quantizers with constrained structure (Cartesian product and multiple stages). A large family of variable rate quantizers can in fact be based on constrained structure vector quantizers such as the quantizers already mentioned having multiple stages, Cartesian products, but also tree-based vector quantizers. The use of these tree-based vector quantizers for variable rate coding has formed the subject of numerous studies. The binary tree-based vector quantizer was the first to be introduced. It derives naturally from the LBG algorithm for designing a vector quantizer by successive splittings of the centroids on the basis of the "root" node, the barycentre of the training sequence. Variant tree-type vector quantizers have been proposed based on pruning or on the contrary based on ramifying certain nodes of the tree according to their attributes such as their distortion, their population leading to nonbinary and/or nonequilibrated tree-based vector quantizers.

FIGS. 1a and 1b represent tree-structured vector quantizers. More particularly, FIG. 1a represents an equilibrated binary tree, whereas FIG. 1b represents a nonbinary and nonequilibrated tree.

Multi-resolution vector quantizers are easily constructed on the basis of a tree-type vector quantizer, by selecting the number of nodes corresponding to the various resolutions desired. The tree-type hierarchical structure is appealing and simplifies the search procedure. On the other hand, it involves a suboptimal search and a significant increase in the necessary memories since all the nodes of the tree from the root-node to the terminal nodes via all the nodes of the intermediate levels must be stored. Moreover, as the set of nodes of a dictionary of lower resolution is not included in the dictionaries of higher resolution, the decrease in the quantization error as a function of the increase in the rate of the vector quantizer is not guaranteed locally.

Moreover it is known how to construct variable resolution quantizers on the basis of algebraic codes, in particular EAVQ embedded algebraic vector quantizers which use subsets of spherical codes of the regular Gosset lattice in dimension 8.

In the document:
"A 16, 24, 32 kbit/s wideband speech codec based on ACELP" by P. Combescure, J. Schnitzler, K. Fischer, R. Kircherr, C. Lamblin, A. Le Guyader, D. Massaloux, C. Quinquis, J. Stegmann, P. Vary, in Proceedings IEEE International Conference on Acoustics, Speech, and Signal Processing, Vol. 1, pp 5-8, 1999, this embedded algebraic vector quantization approach has been extended to variable dimension quantization using algebraic codes of various dimensions. Even though this generalization of EAVQ quantization makes it possible to quantize vectors of variable dimension at variable resolutions, it has drawbacks.

The distribution of the input vectors must be uniform. However, to adapt the distribution of the source to this constraint is a very difficult task. The design of algebraic quantizers based on regular lattices also poses the problem of truncating and tailoring the regions of the various regular lattices to obtain the various resolutions desired, doing so for the various dimensions.

The present invention aims to improve the situation.

OBJECTS OF THE INVENTION

One of the aims of the present invention is, in a general manner, to propose an effective and economical solution (in particular in terms of storage memory) to the problem of the variable rate quantization of vectors of variable dimension.

Another aim of the present invention is, in a nonlimiting manner, to propose a vector quantization that advantageously accommodates the coding and decoding of digital signals using a quantization of the spectral amplitudes of harmonic coders and/or of the transform coefficients of frequency coders, in particular of speech and/or audio signals.

SUMMARY OF THE INVENTION

To this end it proposes a dictionary comprising codevectors of variable dimension and intended to be used in a device for compression coding and/or decoding of digital signals, by vector quantization at variable rate defining a variable resolution, the dictionary comprising:

on the one hand, for a given dimension, inter-embedded dictionaries of increasing resolution, and, on the other hand, for a given dimension, a union:
of a first set consisting of codevectors constructed by inserting, into codevectors of dictionaries of lower dimension, elements taken from a finite set of real numbers according to a finite collector of predetermined insertion rules, and of a second set consisting of codevectors that may not be obtained by insertion into codevectors of lower dimension of the elements of said finite set according to said collection of insertion rules.

Preferably, said collection of insertion rules is formulated on the basis of elementary rules consisting in inserting a single element of the finite set of reals in the guise of component at a given position of a vector.

Each elementary rule is preferably defined by a pair of two positive integers representative:
of a rank of the element in said finite set,
and of a position of insertion.

It will be understood that the insertion rules thus characterized are read and are deduced directly from the actual structure of the dictionary within the meaning of the invention.

Of course, in a purely reversible manner, it is possible to define deletion rules consisting in deleting one or more elements of a finite set of given dimension N' so as to attain a lower dimension N (N<N').

The present invention is also aimed at a method for forming a dictionary according to the invention, in which, for a given dimension:

a) a first set consisting of codevectors formed by inserting/deleting into/from codevectors of dictionaries of lower/higher dimension elements taken from a finite set of real numbers according to a finite collection of predetermined insertion/deletion rules, b) a first, intermediate, dictionary comprising at least said first set is constructed, for said given dimension, c) and, to adapt said dictionary to a use with at least one given resolution, a second, definitive, dictionary is constructed, on the basis of the intermediate dictionary, by embedding/simplification of dictionaries of increasing/decreasing resolutions, the dictionaries of increasing resolutions being inter-embedded from the dictionary of smallest resolution up to the dictionary of greatest resolution.

Of course, the terms "embedding of a set A in a set B" are intended to mean the fact that the set A is included in the set B. Furthermore, the terms "simplification of a set A to obtain a set B" are intended to mean the fact that the set A includes the set B.

By way of variant or supplement, it is understood that steps a) and b), on the one hand, and step c), on the other hand, may be substantially reversed to adapt said dictionary to a use with a given dimension N of codevectors.

In this case:

in step c), a first, intermediate, dictionary still of dimension N' but of higher/lower resolution $r_N$ is constructed on the basis of an initial dictionary of resolution $r_N$ and of dimension N' by embedding/simplification of dictionaries of increasing/decreasing resolutions, so as to substantially attain the resolution $r_N$ of said first dictionary, in step a), to attain the given dimension N, a first set consisting of codevectors formed by inserting/deleting, into/from codevectors of the first dictionary of dimension N' lower/higher than said given dimension N elements taken from a finite set of real numbers according to a finite collection of predetermined insertion/deletion rules is constructed, and, in step b), subsequent to a possible step of definitive adaptation to the resolution $r_N$, a second, definitive, dictionary comprising at least said first set is constructed for said given dimension N.

It is possible to implement step a) by increasing successive dimensions. In this case, for a given dimension N:

a0) an initial dictionary of initial dimension n, lower than said given dimension N, is obtained, a1) a first set consisting of codevectors of dimension n+i formed by inserting into codevectors of the initial dictionary elements taken from a finite set of real numbers according to a finite collection of predetermined insertion rules is constructed, a2) there is provided a second set consisting of codevectors of dimension n+i that may not be obtained by insertion into the codevectors of the initial dictionary of the elements of said finite set with said collection of insertion rules, a3) an intermediate dictionary, of dimension n+i comprising a union of said first set and of said second set is constructed, and steps a1) to a3) are repeated, at most N−n−1 times in which case (i=1), with said intermediate dictionary in the guise of initial dictionary, up to said given dimension N.

It is also possible to implement step a) by decreasing successive dimensions. In this case, for a given dimension N:

a'0) an initial dictionary of initial dimension n, higher than said given dimension N, is obtained, a'1) a first set, of dimension n−i, is constructed by selection and extraction of possible codevectors of dimension n−i from the dictionary of dimension n, according to a finite collection of predetermined deletion rules, a'2) there is provided a second set consisting of codevectors of dimension n−i, that may not be obtained simply by deletion, from the codevectors of the initial dictionary, of the elements of said finite set with said collection of deletion rules, a'3) an intermediate dictionary, of dimension n−i comprising a union of said first set and of said second set is constructed, and steps a'1) to a'3) are repeated, at most n−N−1 times in which case (i=1), with said intermediate dictionary in the guise of initial dictionary, up to said given dimension N.

To obtain a plurality of N dictionaries of successive dimensions 1 to N, it is possible to combine steps a1) to a3) and steps a'1) to a'3), preferably on the basis of an initial dictionary of dimension n(n<N) and through the repeated implementation of steps a1) to a3) for the dimensions n+1 to N, and through the repeated implementation of steps a'1) to a'3) for the dimensions n−1 to 1.

One thus obtains all or part of N dictionaries of which the dictionary of largest dimension has dimension N.

The finite set and the collection of insertion/deletion rules serving for the construction of dictionaries of successive dimensions may be defined:

a priori, before constructing the dictionary, by analysis of a source to be quantized, or a posteriori, after the construction of dictionaries, preferably by embedding/simplification of dictionaries of successive resolutions, this construction then being followed by a statistical analysis of these dictionaries thus constructed.

It is indicated that the source to be quantized is preferably modelled by a learning sequence and the "a priori" definition of the finite set and of the collection of insertion/deletion rules is preferably effected by statistical analysis of the source. The aforesaid finite set is preferably chosen by estimation of a monodimensional probability density of the source to be quantized.

By combining a priori and a posteriori definitions of the finite set and of the insertion rules:

a first set and a first collection of insertion/deletion rules may advantageously be chosen a priori by analysis of a learning sequence, so as to form one or more intermediate dictionaries, at least one part of said first set and/or of said first collection of insertion/deletion rules is updated by a posteriori analysis of said one or more intermediate dictionaries, and, as appropriate, at least one part of the set of codevectors forming said one or more intermediate dictionaries is also updated.

Preferably, step c) of adaptation to a given resolution comprises the following operations, to attain increasing resolutions:

c0) an initial dictionary of initial resolution $r_n$, lower than said given resolution $r_N$, is obtained, c1) on the basis of the initial dictionary, an intermediate dictionary of resolution $r_{n+1}$ higher than the initial resolution $r_n$ is constructed, c2) operation c1) is repeated until the given resolution $r_N$ is attained.

Advantageously, for each iteration of operation c1), there is provided a construction of classes and of centroids, in which the centroids belonging at least to the dictionaries of resolution higher than a current resolution $r_i$ are recalculated and updated. Furthermore, the centroids which belong to the dictionaries of resolution lower than a current resolution $r_i$ are updated preferably only if the total distortions of all the dictionaries of lower resolution are decreasing from one update to the next.

By way of supplement or variant, step c) comprises the following operations, now to attain decreasing resolutions:

c'0) an initial dictionary of initial resolution $r_n$, higher than said given resolution $r_N$, is obtained, c'1) on the basis of the initial dictionary, an intermediate dictionary of resolution $r_{n-1}$ lower than the initial resolution $r_n$, is constructed by partitioning of the initial dictionary into several subsets ordered according to a predetermined criterion, and c'2) operation c'1) is repeated until the given resolution $r_N$ is attained.

Advantageously, this partitioning may use the partial composition by controlled extension within the meaning of steps a) and b), using a part at least of the insertion/deletion rules implemented.

To obtain a plurality of N successive dictionaries of respective resolutions $r_1$ to $r_N$ on the basis of an initial dictionary of intermediate resolution $r_n$ between the resolutions $r_1$ and $r_N$, it is advantageously possible to implement a repetition of step c1) for the increasing resolutions $r_{n+1}$ to $r_N$, and through the repeated implementation of step c'1) for the decreasing resolutions $r_{n-1}$ to $r_1$.

It will be understood that the finite set and the collection of insertion/deletion rules may advantageously be chosen thorough a study, a posteriori, of a statistic of the thus obtained dictionaries of various resolutions and dimensions, to form a dictionary within the meaning of the invention, of desired dimensions and resolutions.

According to one of the advantages afforded by the present invention, the memory storage required for the implementation of the coding/decoding may be considerably reduced. Specifically, advantageously, there is stored in a memory, once and for all, said collection of insertion/deletion rules, each identified by an index, and, for a given dimension:

said second set consisting of codevectors that may not be obtained by application of the insertion/deletion rules to codevectors of lower/higher dimension than the given dimension, as well as at least one correspondence table making it possible to reconstitute any codevector of the dictionary of given dimension, using the indices of the insertion/deletion rules and indices identifying elements of said second set.

Thus the complete storage of the dictionary for said given dimension is avoided, by simply storing the elements of said second set and links in the correspondence table for access to these elements and to the associated insertion/deletion rules.

Thus, it will be understood that, for a given dimension, the second aforesaid set may advantageously consist of "second" subsets of dimensions lower than said given dimension.

In an embodiment, the insertion/deletion mechanism itself may be stored in the guise of program routine, while the insertion/deletion parameters, for a given insertion/deletion rule, may be stored in a general correspondence table (in principle different from the aforesaid correspondence table), in combination with the index of this given insertion/deletion rule.

Preferably, the correspondence tables are formulated previously, for each index of a codevector of a dictionary of given dimension that may be reconstructed on the basis of elements of current indices in the second set of current dimension, through a tabulation of three integer scalar values representing:

a current dimension of said second set, a current index of an element of the second set, an insertion/deletion rule index, this insertion/deletion rule at least contributing to reconstitute said codevector of the dictionary of given dimension, by applying the insertion/deletion to the element corresponding to said current index and to said current dimension.

These latter characteristics may advantageously be implemented in a compression coding/decoding method, as described hereinbelow.

In this regard, the present invention is also aimed at a use of the dictionary according to the invention and obtained through the implementation of the steps hereinabove, for the compression coding/decoding of digital signals, by vector quantization at variable rate defining a variable resolution. In particular a search is made for the codevector which is the nearest neighbour of an input vector $y=(y_0, \ldots, y_k, \ldots, y_{j-1})$ in a dictionary of given dimension j. This use implements then the following steps:

CO1) for a current index of said codevector sought, reconstitution at least partial of a codevector of index corresponding to said current index, at least through the prior reading of the indices appearing in the correspondence tables and, where appropriate, of an element of the second set making it possible to formulate said dictionary, the method continuing with coding/decoding steps proper, comprising:

CO2) at least on coding, calculation of a distance between the input vector and the codevector reconstituted in step CO1), CO3) at least on coding, repetition of steps CO1) and CO2), for all the current indices in said dictionary, CO4) at least on coding, identification of the index of the codevector at least partially reconstituted whose distance, calculated in the course of one of the iterations of step CO2), with the input vector is the smallest, and CO5) at least on decoding, determination of the nearest neighbour of the input vector (y) in the guise of codevector whose index has been identified in step CO4).

As indicated hereinabove, it is recalled that the "second" aforesaid set preferably consists of "second" subsets of dimensions lower than a given dimension of the second set.

In a particular embodiment, step CO1), at least on decoding, comprises:

CO11) the reading, in the correspondence tables, of indices representative of links to said second set and to the insertion rules and including:

the index of a current dimension of a subset of said second set, the current index of an element of said subset, and the index of the appropriate insertion rule for the construction of the codevector of the dictionary of given dimension, on the basis of said element, CO12) the reading, in the subset identified by its current dimension, of said element identified by its current index, CO13) the complete reconstitution of the codevector to said given dimension by applying to said element read in step CO12) the appropriate insertion rule identified by its index read in step CO11).

In a particular embodiment, on coding, step CO1) comprises:

CO11) the reading, in the correspondence tables, of indices representative of links to said second set and to the insertion rules and including:

the index of a current dimension of a subset of said second set, the current index of an element of said subset, and the index of the appropriate insertion rule for the construction of the codevector of the dictionary of given dimension, on the basis of said element, CO12) the reading, in the subset identified by its current dimension, of said element identified by its current index, in step CO2), said distance is calculated as a function of a distortion criterion estimated as a function of:

of said insertion rule, and of said element.

Thus, it is possible to provide for only a partial reconstruction of the codevector with said given dimension in step CO1), by reserving the complete reconstruction simply for decoding.

In an advantageous embodiment, there is provided furthermore a supplementary structuring property according to a union of permutation codes and an index of this union of permutation codes is utilized in the implementation of the following steps:

CP1) on the basis of an input signal, an input vector $y = (y_0, \ldots, y_k, \ldots, y_{j-1})$ defined by its absolute vector $|y| = (|y_0|, \ldots, |y_k|, \ldots, |y_{j-1}|)$ and by a sign vector $\epsilon = (\epsilon_0, \ldots, \epsilon_k, \ldots, \epsilon_{j-1})$ with $\epsilon_k = \pm 1$ is formed, CP2) the components of the vector $|y|$ are ranked by decreasing values, by permutation, to obtain a leader vector $|\tilde{y}|$, CP3) a nearest neighbour $x^{j'}$ of the leader vector $|\tilde{y}|$ is determined from among the leader vectors of the dictionary $D_i^j$ of dimension j, CP4) an index of the rank of said nearest neighbour $x^{j'}$ in the dictionary $D_i^j$ is determined, CP5) and an effective value of coding/decoding is applied to the input vector, which is dependent on said index determined in step CP4), on said permutation determined in step CP2) and on said sign vector determined in step CP1).

According to another advantageous aspect of the invention, for the coding/decoding and possibly for the construction of the dictionary or dictionaries, there is provision to store the correspondence tables and the elements of the second set mentioned above, in particular in a memory of a compression coding/decoding device.

In this regard, the present invention is also aimed at such a coding/decoding device.

The present invention is also aimed at a computer program product intended to be stored in a memory of a processing unit, in particular of a computer or of a mobile terminal, or on a removable memory medium and intended to cooperate with a reader of the processing unit, this program comprising instructions for the implementation of the method of constructing dictionaries hereinabove.

The present invention is also aimed at a program of this type, in particular a computer program product intended to be stored in a memory of a processing unit, in particular of a computer or of a mobile terminal integrating a coding/decoding device, or on a removable memory medium and intended to cooperate with a reader of the processing unit, this program then comprising instructions for the implementation of the application to compression coding/decoding hereinabove.

BRIEF DESCRIPTION OF THE DRAWINGS

Other characteristics and advantages of the invention will become apparent on examining the detailed description hereinbelow, and the appended drawings in which, apart from FIGS. 1a and 1b described hereinabove:

FIG. 3 illustrates the embedding of the dictionaries as a function of increasing resolutions,
FIGS. 7a to 7g represent, for the broadband TDAC coder using a vector quantizer within the meaning of the invention, arrays illustrating respectively:
- a splitting into 32 bands (FIG. 7a),
- the resolutions per dimension (FIG. 7b),
- the memory gain afforded by the embedding property (FIG. 7c),
- the memory gain afforded by the two properties of embedding and of controlled extension (FIG. 7d),
- the memory gain afforded by the two structuring properties as a function of dimension and of rate, respectively, with respect to the memory size required for the storage of a dictionary without using these two properties (FIG. 7e),
- the first leaders of the set $L^0$ in dimensions 1, 2 and 3 (FIG. 7f), and
- the leaders of the permutation codes of the dictionaries in dimension 3 (FIG. 7g),
FIGS. 8a and 8b represent, for the FM band TDAC coder, arrays illustrating respectively:
- a splitting into 52 bands (FIG. 8a), and
- the resolutions per dimension (FIG. 8b).

MORE DETAILED DESCRIPTION

Figure 2A:
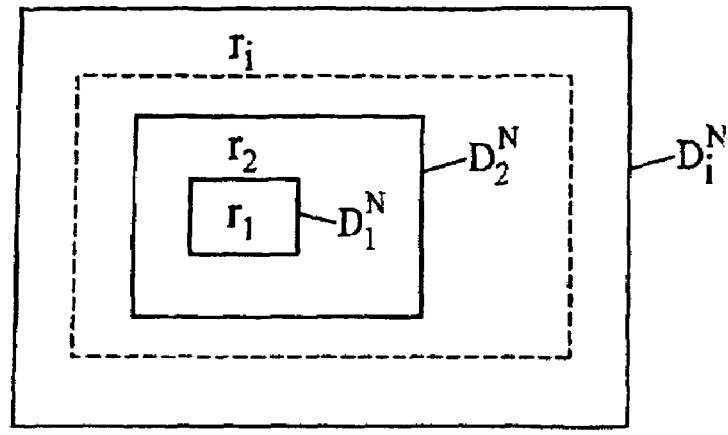
FIG. 2a illustrates the property of embedding of a dictionary within the meaning of the invention, for a given dimension N.
Figure 2B:
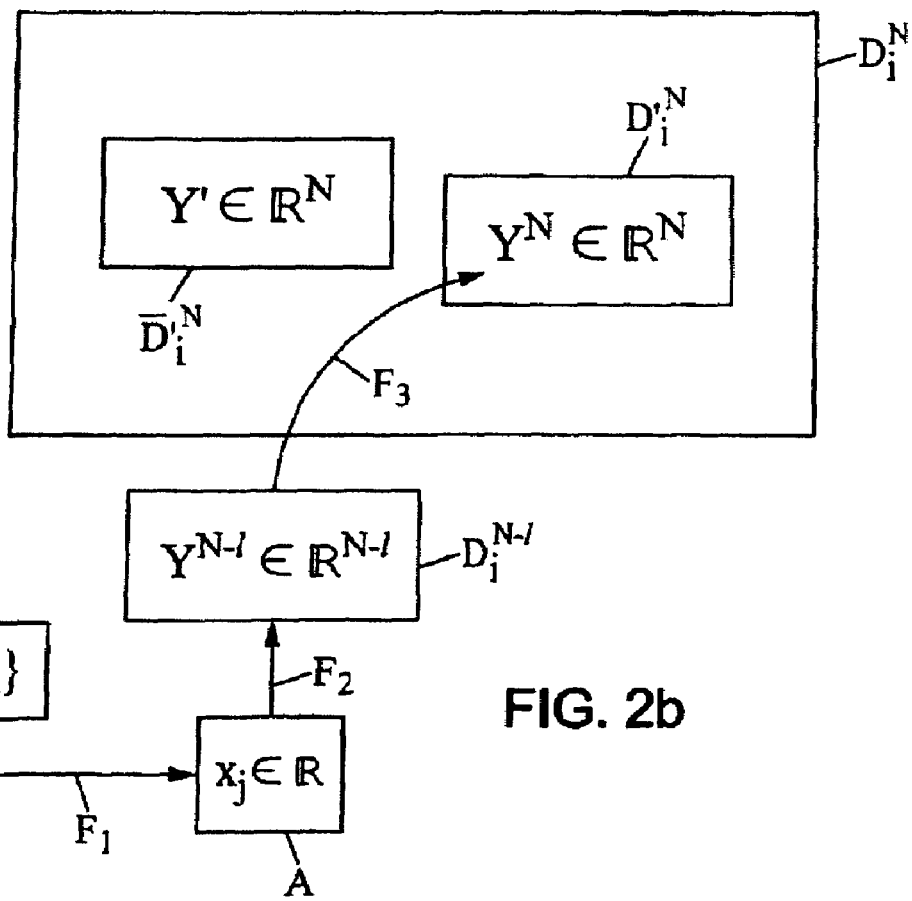
FIG. 2b illustrates the property of partial composition by controlled extension of a dictionary within the meaning of the invention.

Referring firstly to FIGS. 2a and 2b which illustrate the two main properties of a dictionary $D_i^N$ within the meaning of the present invention.

In FIG. 2a, for a given dimension N, dictionaries $D_1^N, D_2^N, \ldots, D_i^N$ of respective increasing resolutions $r_1, r_2, \ldots, r_i$ are embedded inside one another. Thus, the dictionary $D_i^N$ of maximum resolution $r_i$ may make it possible to determine a dictionary $D_j^N$ of lower resolution $r_j$ (j<i), as will be seen later. This first property, denoted PR, is dubbed hereinbelow "embedding property".

Referring now to FIG. 2b, any dictionary $D_i^N$ of a given dimension N and of resolution $r_i$ is the union of two disjoint sets:
a first set $D'^N_i$ consisting of codevectors $Y^N$ constructed (arrow F3) by inserting, into codevectors $Y^{N-1}$, dictionaries $D_i^{N-1}$ of lower dimension N−1 of the elements $x_j$ taken (arrow F2) from a finite set A of real numbers according to a finite collection of insertion rules $\{R_m\}$, an insertion rule $R'(j,k)$ determining the elements $x_j$ to be inserted (arrow F1) and the way of inserting them (for example at a position k of the vector $Y^N$ under construction),
and a second set $$\overline{D}'^N_i$$

consisting of vectors Y' that cannot be obtained by inserting into codevectors of lower dimension elements of this finite set according to the aforesaid collection of insertion rules.

This second property, denoted PD, is dubbed hereinbelow "property of partial composition by controlled extension".

In FIGS. 2a and 2b and in the summary of the invention hereinabove, the indices for resolution and/or for dimension begin, by way of example, from the integer 1 up to a given integer (i, n, or N as the case may be). The person skilled in the art of programming, in particular in the C++ language, will understand that these indices may start rather from 0 and reach i−1, n−1, or N−1, according to context. Thus, in the example of FIG. 3 which will be described later, the largest resolution reached is $N_j-1$, starting from 0.

Described hereinbelow is a method of constructing a dictionary possessing the two structuring properties PR and PD, in particular algorithms for constructing these dictionaries thus structured. The links induced by the two structuring properties are advantageously utilized to develop algorithms for constructing such dictionaries by adapting the iterative construction algorithms commonly used and described hereinabove such as "GLA" or "SKA".

In a general manner, it is indicated that:
interrelated dictionaries of different resolutions and of the same dimension are constructed successively using the embedding property PR,
as a supplement or variant, dictionaries of different dimensions, interrelated by the property PD of partial composition by controlled extension, are constructed,
and thus dictionaries of various dimensions and resolutions possessing the two structuring properties PD and PR are obtained.

In a general manner, to construct embedded dictionaries by increasing resolution for a given dimension (PR), three construction approaches are proposed.

A first approach consists in constructing the dictionaries according to increasing resolutions (from the smallest resolution up to the maximum resolution).

A second approach consists conversely in constructing the dictionaries according to decreasing resolutions (from the maximum resolution down to the smallest resolution).

A third approach consists in constructing the dictionaries on the basis of a dictionary of intermediate resolution by decreasing the resolutions down to the minimum resolution and by increasing them up to the maximum resolution. This process is particularly beneficial when the nominal resolution of the vector quantizer of variable resolution is the aforesaid intermediate resolution.

The property PR of embedding of the dictionaries, for a dimension j is finally conveyed by:

$$D_0^j \subset D_1^j \subset \ldots D_i^j \subset D_{i+1}^j \ldots \subset D_{Nj-1}^j$$

Writing:
$N_j$ the number of resolutions (or of rates possible in a variable rate coder) for dimension j,
the set of resolutions for dimension j $$R_j = \{r_0^j, r_1^j, \ldots, r_i^j, r_{i+1}^j, \ldots, r_{Nj-1}^j\},$$

with $r_0^j < r_1^j < \ldots < r_i^j < r_{i+1}^j < \ldots < r_{Nj-1}^j$
$D_i^j$ the dictionary of dimension j, of resolution $r_i^j$
$T_i^j$ the size of the dictionary of resolution $$r_i^j \left( T_i^j = 2^{jr_i^j} \text{ i.e. } r_i^j = \frac{1}{j} \log_2 T_i^j \right)$$

FIG. 3 illustrates the embedding of the dictionaries as a function of increasing resolutions.

Figure 5:
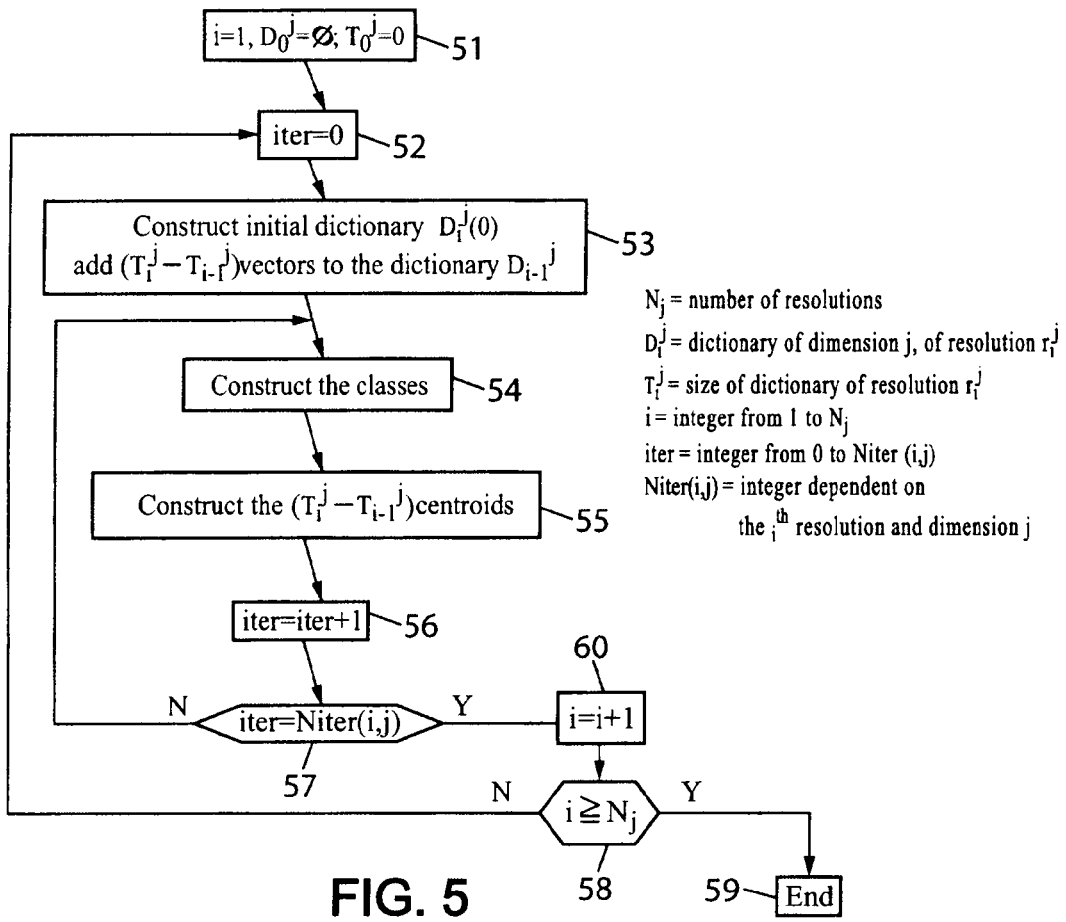
FIG. 5 illustrates the construction according to increasing resolutions of embedded dictionaries without reupdating of the dictionaries of lower resolution.

The flowchart of the algorithm for construction according to increasing resolutions without reupdating of the dictionaries of lower resolution is given in FIG. 5.

Referring to FIG. 5, one firstly constructs the dictionary $D_0^j$ of lowest resolution, subsequent to the initialization steps 51 and 52 where one firstly fixes i=0 and the loop iteration index iter=0. Then the dictionary $D_0^j$ of lowest resolution being fixed, the dictionary of immediately higher resolution $D_1^j$ is constructed with the aid of a variant of a conventional construction algorithm described hereinbelow. The method is thereafter iterated until the dictionary of maximum resolution $D_{Nj-1}^j$ is constructed.

Thus, in step 53 where, by an iterative process, one seeks to construct a dictionary $D_i^j$ on the basis of an initial dictionary $D_i^j(0)$, formed by appending $(T_i^j - R_{i-1}^j)$ vectors to the dictionary $D_{i-1}^j$ of lower resolution $r_{i-1}$. The algorithm for constructing classes 54 is identical to a conventional algorithm but the algorithm for constructing the $T_i^j$ centroids 55 is modified. Specifically, the $(T_i^j - T_{i-1}^j)$ centroids not belonging to the dictionaries of lower resolution are recalculated and updated, while the $(T_{i-1}^j)$ centroids of the dictionaries of lower resolution are not reupdated. A variant permits the reupdating of the centroids of the dictionaries of the lower resolutions in the case where the total distortions of all the dictionaries of lower resolution decrease or remain constant. In this case, the dictionaries of lower resolutions are modified accordingly.

The loop index iter is thereafter incremented (step 56) up to a number Niter(i,j) dependent on the $i^{th}$ resolution and on the dimension j (test 57). Once the desired resolution $N_j$ is reached (test 58), we obtain the dictionary at this resolution $N_j$ (end step 59), and hence the set of dictionaries $D_i^j$ of resolution $r_i$, for i ranging from 1 to $N_j$.

To construct the dictionaries according to decreasing resolutions, one firstly constructs the dictionary of highest resolution. Then the latter being fixed, one performs a partition of the latter into several subsets that are ordered according to a certain criterion. Several criteria may serve to order the partition. It is for example possible to order the subsets according to their cardinal, their invoking in the learning sequence (that is to say the cardinal of their quantization regions), their contribution to the total distortion or more precisely to the decrease in this distortion. It is obviously possible to combine various criteria and weight their respective significance. Likewise, the partitioning of the dictionary may be performed in various ways: from elementary partitioning (one element in each subset) to more elaborate partitioning. This ordered partitioning is at the basis of the construction of the embedded dictionaries by progressive union of its ordered classes.

Preferably, the partition may be based on the property PD of partial composition by controlled extension by grouping together the elements based on the extension of one and the same codevector on the basis of a subset of the collection of insertion rules (possibly equal to this set itself).

It should be noted that it is possible to do several iterations by alternating the various procedures. For example, embedded dictionaries are constructed according to the increasing resolutions procedure then the decreasing resolutions procedure is applied. By combining the two methods above, dictionaries embedded by resolution are constructed on the basis of a dictionary of intermediate resolution $r_i$. This $i^{th}$ dictionary is therefore firstly constructed. Then, on the basis of this dictionary, the dictionaries of lower resolution are constructed with the aid of the second method by decreasing resolutions and the dictionaries of higher resolutions with the aid of the first method by increasing resolutions.

In a general manner, three approaches are also proposed for constructing dictionaries of various dimensions by partial composition by controlled extension (property PD).

A first approach consists in increasing the dimensions. Another approach consists in decreasing them. Finally, a last approach consists in beginning by constructing the dictionary of an intermediate dimension and constructing by successive increasing and decreasing of the dimension the dictionaries of higher and lower dimensions. The partial composition by controlled extension has led to a fine-tuning of the procedures for determining the finite set of reals and of the collection of insertion rules that will be seen hereinbelow. It is simply indicated here that, preferably, the proportion of "extended" elements (number of elements of the first set with respect to the cardinal of the dictionary) is increasing with dimension, thereby making it possible to reduce the cost of storage of the second set, increasing with dimension. This proportion may be fixed a proiri by the complexity constraints of the application (memory/calculation power) or left "free". In the latter case, the construction algorithm advantageously favors the elements of the first set comprising the elements obtained by controlled extension, as will be seen hereinbelow.

Thus, the second property PD of partial composition by controlled extension is finally conveyed by:

$$D_i^j = D_i'^j \cup \overline{D_i'^j}$$

by writing:

$D'^j_i$ the set of codevectors of $D_i^j$ which may be obtained by inserting into codevectors of dictionaries of lower dimensions elements taken from a finite set A of R according to a collection of insertion rules $\{R_m\}$, $\overline{D_i'^j}$ its complement in $D^j_i$, the set of codevectors of $D_i^j$ that cannot be obtained by inserting into codevectors of lower dimension elements of A according to the collection of insertion rules $\{R_m\}$.

Described hereinbelow is an example of insertion rules for verifying the second property PD.

Firstly, a collection of elementary insertion rules is defined: each elementary rule consists in inserting one and only one element of the finite set of reals A as component at a given position of a vector. Each elementary rule is given by a pair of two positive integers, one giving the rank of the element in the finite set and the other the position of insertion. On the basis of this collection of elementary rules, it is possible to compose any more elaborate rule for inserting components.

Of course, in a purely reversible manner, it is possible to define deletion rules consisting in deleting one or more elements of a finite set of given dimension N to reach a lower dimension N−n.

To define an insertion rule, we then write:

$N_a$ the cardinal of A and $a_i$ its $i^{th}$ element:

$A = \{a_0, a_1, \ldots, a_i \ldots, a_{Na-1}\}$,

R' ($i_m$, $p_m$) the elementary insertion rule which consists in inserting $a_{im}$ at position $p_m$.

Thus, if the maximum dimension is $j_{max}$, the number of possible elementary rules is $N_a * j_{max}$. For example, for $N_a = 2$ and $j_{max} = 3$, six possible elementary rules are counted in all:

R' (0,0): insert $a_0$ at position 0,
R' (1,0): insert $a_1$ at position 0,
R' (0,1): insert $a_0$ at position 1,
R' (1,1): insert $a_1$ at position 1,
R' (0,2): insert $a_0$ at position 2,
R' (1,2): insert $a_1$ at position 2

The composite of rules R' (0,0) and R' (0,1) gives the rule: insert $a_0$ at positions 0 and 1. It makes it possible thus to obtain a codevector of dimension j+2 on the basis of a codevector of dimension j.

The composite of rules R' (1,0) and R' (0,2) gives the rule: insert $a_1$ at position 0 and $a_0$ at position 2. It makes it possible thus to obtain a codevector of dimension j+2 on the basis of a codevector of dimension j.

More generally, we write $R(n, \{(i_m, p_m)\} m=0, n=1)$ for the composite of the n elementary rules R' ($i_m, p_m$) (from m=0 to n−1), which makes it possible to obtain a codevector of dimension j+n on the basis of a codevector of dimension j. It should be noted that the $i_m$ are not necessarily different, by contrast the n positions $p_m$ are distinct. Preferably, the positions $p_m$ are arranged in increasing order, i.e.:

$p_0 < p_1 \ldots < p_m \ldots < p_{n-1}$.

Figure 4:
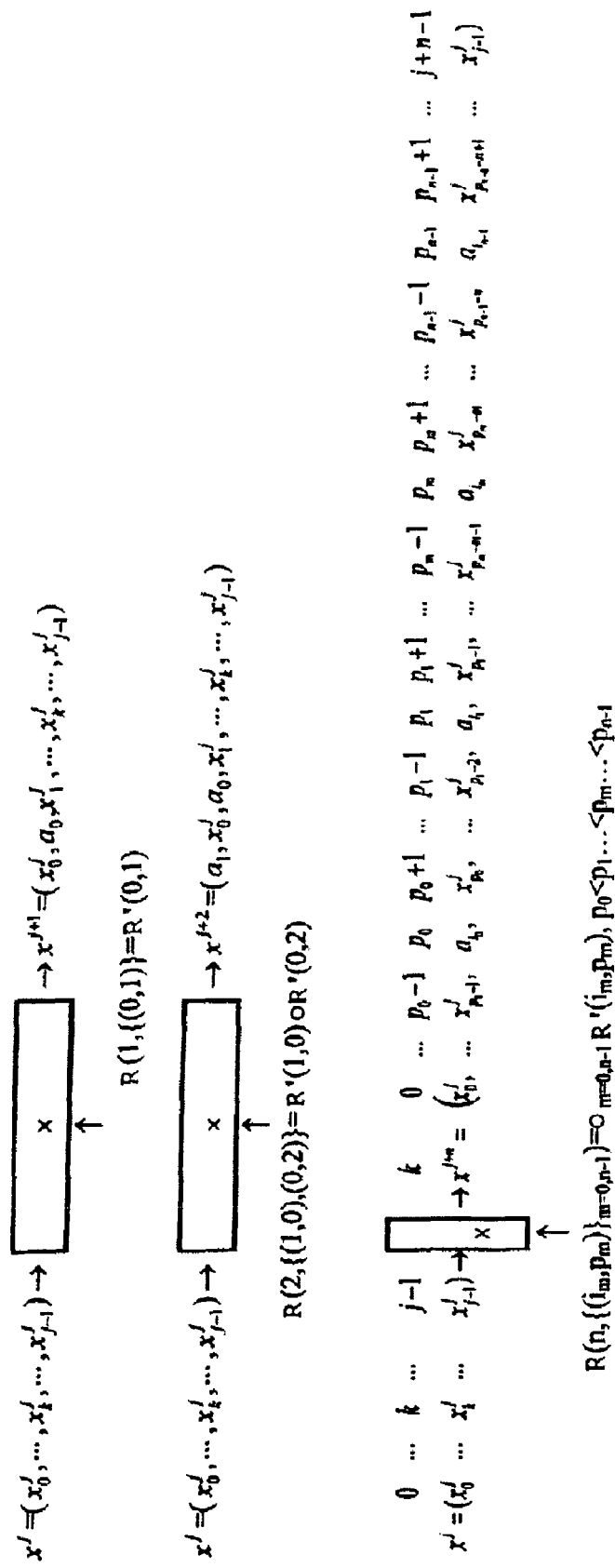
FIG. 4 illustrates the composition of codevectors of a dictionary on the basis of codevectors of dictionaries of lower dimensions and of insertion rules.

FIG. 4 illustrates the composition of codevectors of a dictionary on the basis of codevectors of dictionaries of lower dimensions and of insertion rules.

There are also provided several embodiments for constructing dictionaries of various dimensions, unions of two disjoint sets, a first set consisting of codevectors constructed by inserting at codevectors of the dictionaries of the lower dimensions elements taken from a finite set of real numbers according to a collection of insertion rules, a second set consisting of vectors that cannot be obtained by inserting at the codevectors of lower dimension elements of this finite set of real numbers according to this collection of insertion rules.

The first set requires the determination of the finite set of reals (that is to say its cardinal and its values) as well as of the collection of insertion rules.

The construction of this finite set and the formulation of the collection of insertion rules are performed:

either "a priori": the finite set and the collection of insertion rules are determined before constructing the dictionaries. This choice is based preferably on an analysis of the statistics of the source to be quantized, modelled for example by a learning sequence. For example, the choice of the finite set may be based on the monodimensional probability density of the source (or its histogram);

or "a posteriori": one firstly constructs the dictionaries embedded by resolution for all the dimensions without imposing the need to follow the rule of partial composition by controlled extension. The choice of the finite set and of the collection of insertion rules is then made by a study of the statistic of these "initial" dictionaries.

The two solutions "a priori" or "a posteriori" may be used successively and/or combined. For example, a first set and a first collection of insertion rules may be chosen by an analysis of the learning sequence, then after a first construction of the dictionaries, an analysis of these dictionaries may lead to a total or partial update of the set A and/or of the collection of insertion rules.

It should also be noted that the finite set and/or the collection of insertion rules may be dependent or otherwise on the dimensions. It is then possible to determine a collection and/or a set that is specific for each pair of dimensions (j,j'), or a collection and/or a set that is specific by difference of dimension, or to determine a global set. Here again, the choice is made a priori or after statistical analysis of the learning sequence and/or of the dictionaries.

To construct the dictionaries according to increasing dimensions, one firstly constructs the dictionary of lowest dimension by a conventional procedure of vector quantization design, as indicated above. Then, this dictionary being constructed, the dictionary of immediately higher dimension is constructed with the aid of a variant of a conventional construction algorithm. On the basis of the dictionary of lower dimension, all the possible initial codevectors are composed by applying the insertion rules, this dictionary may possibly be supplemented with "free" codevectors (that is to say those which cannot be obtained by extension). It should be noted that the size of this initial dictionary may be greater than the desired size. On the basis of the initial dictionary, a variant of an iterative algorithm for constructing a vector quantizer is then applied. Classes are constructed by quantization of the learning sequence and centroids are updated by complying with the controlled extension constraint for the codevectors of the first set. For these codevectors of the first set, it is possible either not to recalculate the components obtained by insertion, or to recalculate all the components and modify the codevectors thus obtained so as to bring back the components obtained by the insertion rules. One thus eliminates the empty classes if the size of the dictionary is greater than the desired size. If at the end of the algorithm, the size of the dictionary is greater than the desired resolution, a procedure for classing elements of the dictionary is applied so as to retain only the first codevectors. The iterative algorithm is possibly rerun. One then passes to the construction of the dictionary of the higher dimension, the initial dictionary is then constructed by controlled extension on the basis of the two dictionaries of the two smallest dimensions and supplemented with "free" codevectors, then the variant of the iterative algorithm for constructing a vector quantizer is applied. The method is then iterated, until the dictionary of maximal size is constructed.

As a variant, to construct the dictionaries according to decreasing dimensions, one firstly constructs the dictionary of largest dimension. Then, the latter being fixed, the possible codevectors of lower dimension are extracted. Advantageously, the extraction procedure is facilitated by modifying the codevectors of the higher dimensions so as to bring out elements of A as components of these codevectors.

In a complementary variant, several iterations are advantageously performed by alternating the two constructions according to increasing dimensions, on the one hand, and according to decreasing dimensions, on the other hand.

To facilitate the controlled extension procedure, the invention may in addition carry out a transformation of the components of the codevectors. An exemplary transformation is a scalar quantization at high resolution. It is beneficial to construct "dictionaries" of lower dimensions even if these dimensions are not used directly by the vector quantization. For example, it is possible to begin with the dimension 1 even if the scalar quantization is not used. Likewise, it may also be beneficial to construct dictionaries of intermediate dimensions. These "dictionaries" are moreover advantageously used by the controlled extension procedure to reduce the complexity of storage and of calculations.

It is indicated moreover that by judicially combining algorithms for constructing dictionaries by embedding by resolution (PR) with algorithms for construction by partial composition by controlled extension (PD), several construction methods may be developed. It should be noted that the algorithms being iterative, various techniques may be alternated. For example, one begins by constructing the dictionary of maximal resolution for the smallest dimension, from this one deduces the dictionaries embedded by decreasing resolutions (property PR), then one constructs the dictionary of maximal resolution for the immediately higher dimension by virtue of the property PD, for this dimension, one constructs the dictionaries embedded by resolution and one iterates until the dictionaries (embedded by resolution) of maximal dimension are obtained.

A preferential construction is used in the embodiment described below which combines the techniques of dictionary construction according to increasing dimensions and decreasing resolutions to construct the set of dictionaries $$\{D^j_i\}_{i=0, \ldots, N_{j-1}, j=j_{min}, \ldots, j_{max}}.$$

Described below is the compression coding/decoding of digital signals (audio, video, etc.), using dictionaries within the meaning of the invention, in particular the coding and decoding algorithms which utilize the structure of the dictionaries (embedding and partial composition by controlled extension). In a general manner, it will be understood that optimization of the compromise between memory/calculations at the coder and/or at the decoder is undertaken according to the constraints of the application.

By way of example, considered hereinbelow is the audio coder dubbed "TDAC coder" used to code digital audio signals sampled at 16 kHz (in wideband). This coder is a transform based coder which can operate at various rates. In particular, the rate may be fixed before the establishing of the communication or vary from frame to frame in the course of communication.

Figure 6:
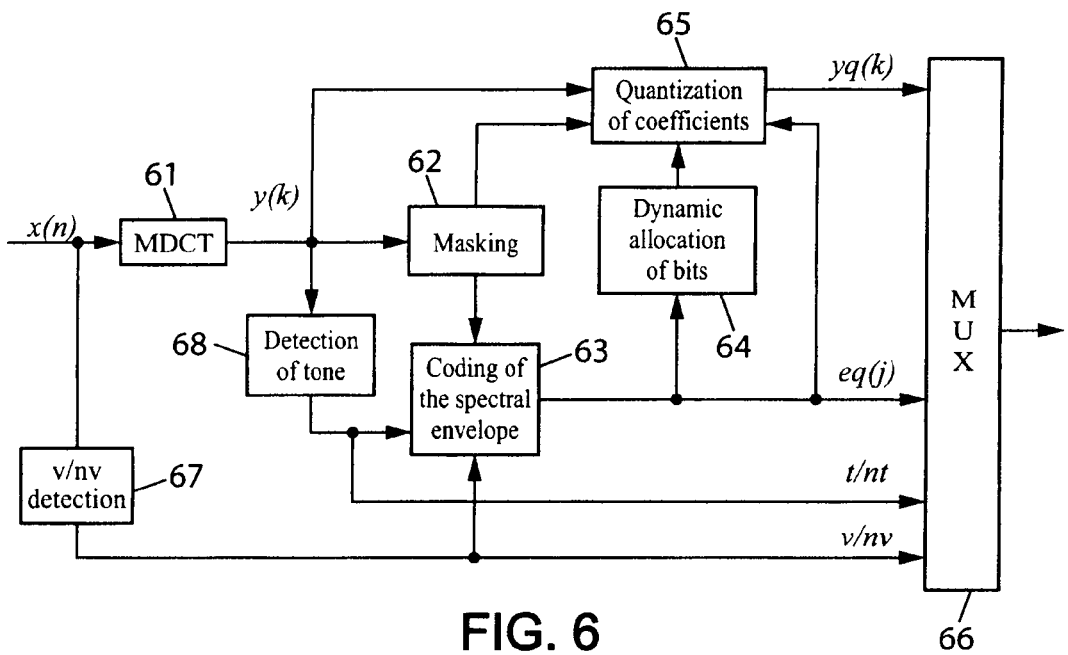
FIG. 6 illustrates the block diagram of the "TDAC" coder.

FIG. 6 gives the block diagram of this TDAC coder. An audio signal x(n) band limited at 7 kHz and sampled at 16 kHz is split into frames of 320 samples (20 ms). A modified discrete cosine transform 61 is applied to blocks of the input signal of 640 samples with an overlap of 50% (that is to say a refreshing of the MDCT analysis every 20 ms). The spectrum obtained y(k) is limited to 7225 Hz by zeroing the last 31 coefficients (only the first 289 coefficients are different from 0). A masking curve is determined by the masking module 62 which then performs a zeroing of the masked coefficients. The spectrum is divided into thirty-two bands of unequal widths. The masked bands, if any, are determined as a function of the transformed coefficients of the signal x(n). For each band of the spectrum, the energy of the MDCT coefficients is calculated (one speaks of scale factors). The thirty-two scale factors constitute the signal's spectral envelope which is thereafter quantized, coded and transmitted in the frame (block 63). This quantization and this coding use a Huffman coding. The variable number of bits remaining after the quantization of the spectral envelope at variable rate is then calculated. These bits are distributed for the vector quantization 65 of the MDCT coefficients of the spectrum. The dequantized spectral envelope serves to calculate the set of bandwise masking thresholds, this masking curve determining the dynamic allocation of the bits 64. The calculation of this masking curve band by band and on the basis of the quantized spectral envelope avoids the transmission of auxiliary information relating to the binary allocation. Specifically, the decoder calculates the dynamic allocation of the bits in an identical manner to the coder. The MDCT coefficients are normalized by the dequantized scale factors of their band then they are quantized by vector quantizers of variable dimension and variable rate. Finally, the binary train is constructed by multiplexing 66 of the information on the spectral envelope and these bandwise normalized coefficients coded and transmitted in a frame. It is indicated that the references 67 and 68 in FIG. 6 correspond to steps known per se of detection of a voiced or unvoiced signal x(n), and of detection of tone (determination of tonal frequencies), respectively.

Described hereinbelow are the vector quantizers with variable rate based on bands of unequal widths of the MDCT coefficiencies in the TDAC coder. The quantization of the bandwise normalized MDCT coefficients uses in particular dictionaries constructed according to the invention. The splitting into bands of unequal widths leads in fact to vectors of various dimensions. The array of FIG. 7a which gives the band splitting used indicates also the resulting dimension of the vector of coefficients, that is to say the number of coefficients, as indicated by the third column.

The variable number of bits remaining after the Huffman coding of the spectral envelope is allocated dynamically to the various bands. The array of FIG. 7b gives the numbers of resolutions $N_j$ and the sets of rates per band $j*R_j$ (hence the values of the resolutions per band) for the dimensions j, for j ranging from 1 to 15. It will be noted that to advantageously utilize the structuring property of partial composition by controlled extension, vector quantizers have been constructed in dimensions 1, 2, 6, 11, which, nevertheless, do not correspond to any bandwidth, but whose elements serve to compose codevectors of larger dimension. Also noted is the fineness of the granularity of the resolutions even for large dimensions.

The zeroing of the masked coefficients in the module 62 leads to the choice, during the analysis of the normalized MDCT coefficients, as starting set A={0} and as collection of insertion rules, of all the possible compounds of the elementary insertion rules. This amounts here to inserting zeros at an arbitrary position.

However, a finer analysis imposes an additional structural constraint on the dictionaries, by using dictionaries formed of a union of normalized permutation codes, of type II according to which all the permutations and all the signs are permitted. For each permutation code of type II, the largest vector, within the lexicographic sense, is called the absolute leader and is obtained by ordering the absolute values of the components in decreasing order. The construction of the dictionaries amounts to determining their normalized absolute leaders. Applying the controlled extension to these absolute leaders then consists in inserting zeros into them as last components.

Moreover, a distortion criterion is fixed. Preferably, the distortion criterion chosen is here the Euclidian distance. The dictionary being normalized, the search for the codevector which minimizes the Euclidean distance with an input vector to be quantized amounts to searching for the codevector which maximizes the scalar product with this input vector. Moreover, the dictionary being the union of permutation codes, the search for the codevector maximizing the scalar product with an input vector amounts to searching among the absolute leaders of the dictionary for that one which maximizes the scalar product with the absolute leader of this input vector (which is also obtained by permutation of the absolute values of its components so as to rank them in decreasing order).

Defined hereinbelow is a learning sequence for the design of vector quantizers within the meaning of the invention. As indicated hereinabove, it is preferable to determine a learning sequence for the design of a quantizer. A long sequence consisting of frames of 289 MDCT coefficients normalized by the scale factor of their band is firstly obtained on the basis of numerous samples of wideband audio signals. Then, for each normalized vector of coefficients, its absolute leader is deduced. On the basis of the set of absolute leaders of various dimensions, two categories of multidimensional learning sequences $S^0$ and $S^1$ are created:

$S^0=\{S^0_j\}j\in[1, 15]$, $S^0_j$ being the set of all the vectors formed by the first j components of the absolute leaders having j nonzero coefficients. $S^0_j$ thus consists of the absolute leaders of dimension j having no zero coefficient, those of dimension j+1 having a single zero coefficient, those of dimension j+2 having two zero coefficients, those of dimension 15 having 15−j zero coefficients, and $S^1=\{S^1_j\}j\in[3, 4, 5, 6, 7, 8, 10, 12, 13, 14, 15]$, $S^1_j$ being the set of all the absolute leaders of the bands having j coefficients.

For example, on the basis of the normalized vector of coefficients (0.;0.6;0.;0.;0.8), we deduce its absolute leader (0.8;0.6;0.;0.;0.) which belongs to the sequence $S^1_5$ and an element of $S^0_2$, (0.8;0.6) formed by the first two nonzero components of its absolute leader.

The first category of sequences is preferably used to determine the initial dictionaries of leaders of the $$\overline{D^{\prime j}_{Nj}}$$

The second category is preferably used to construct multidimensional and multiresolution dictionaries possessing the two structuring properties.

On the basis of the first category $S^0$ of sequences, we obtain a first dictionary of normalized absolute leaders for each dimension j (j ranging from 1 to 15) by applying to the sequence $S^0_j$ a conventional algorithm such as the so-called "k-means algorithm". These leaders with positive real components are modified by suppressing the components below a predetermined threshold, with respect to the first component (that is to say the largest component). This so-called "center-clipping" procedure advantageously makes it possible to bring out zeros and to extract absolute leaders without zero components of lower dimension. To further favor the controlled extension, a transformation of the components of these extracted leaders is applied. For this purpose one uses a normalization of each leader by its smallest nonzero component followed by a uniform scalar quantization of interval 1 with integer reconstruction levels (this amounting to rounding the components of each leader to the nearest integer). This transformation brings about moreover a sizeable reduction in the memory since the absolute leaders may thus be stored in the form of integers by introducing a corrective normalization factor into the distance calculation. It will be noted that different real leaders obtained or otherwise on the basis of various sequences $S^0_j$ may be transformed into one and the same integer leader. There is then provided a procedure for eliminating possible redundancies and for forming the set $$L^{\prime 0} = \underset{j\in[1,...15]}{Y} L^{\prime 0}_j$$

of all the absolute leaders with nonzero integer components, $L^{\prime 0}_j$ being the subset consisting of these leaders of dimension j. This technique for constructing $L^{\prime 0}$ takes its inspiration from the technique of constructing dictionaries by partial composition by controlled extension according to decreasing dimensions. It is also noted that the choice of the set A made a priori could be reviewed a posteriori so as to append thereto the element "1" since all the leaders of $L^{\prime 0}$ have at least one "1" as last component.

The set $L^{\prime 0}$ serves as basis for the composition of the initial dictionaries of leaders for the design of vector quantizers with multiple dimensions and resolutions possessing the two structuring properties of embedding PR and of partial composition by controlled extension PD. On the basis of the sequence $S^1$, the algorithm for constructing these quantizers proceeds through increasing dimension and decreasing resolution.

For a dimension j, the initial dictionary of leaders $L'^1_j$ is formed by all the leaders of $L'^0_j$ and by all the leaders obtained by controlled extension of the leaders of the lower dimensions j'(j'<j) by inserting (j−j') zeros with the leaders of the sets $L'^0_{j'}$. For example in dimension 3, a dictionary of leaders is composed by controlled extension on the basis of $L'^0_1 = \{(1)\}$, $L'^0_2 = \{(11), (21), (31), (41), (51), (91)\}$, supplemented with the leaders of $L'^0_3$.

For each dimension j, the union of the permutation codes, characterized by $L'^1_j$, constitutes a dictionary of high resolution, possibly greater than the maximal resolution desired. These permutation codes therefore perform a natural partition of this dictionary, each class of this partition being a permutation code represented by its leader. The construction of the regions of the nearest neighbour corresponding to the classes of this partition is then performed by quantization of the sequence $S^1$. The partition is ordered according to the increase in cardinal of the permutation codes. In case of equality of the cardinals of the permutation codes, the codes of the leaders obtained by controlled extension are favored with respect to those of the leaders of $L'^0_j$ as indicated hereinabove. In case of equality of cardinals of two classes belonging to the same set (either to $$D'^j_{Nj}, \text{ or to } \overline{D'^j_{Nj}}),$$

the classes are ordered according to a criterion combining the cardinal of their quantization region and their contribution to the decrease in the total distortion. The aggregate of the cardinalities of the permutation codes thus ordered is calculated for each permutation code as is the corresponding rate per vector. We denote by $L^1_j$ the set of thus ordered leaders of $L'^1_j$. To avoid a procedure for arranging the coded indices as a conjoint binary train, one chooses to use only integer resolutions.

The multiresolution dictionaries embedded by resolution, with reference to the array of FIG. 7c, are therefore constituted by choosing as last permutation code of each different resolution that one whose rate of the aggregate of the cardinals is nearest the immediately higher integer. If the resolution of the dictionary characterized by $L^1_j$ is higher than the maximal resolution desired, the last unused permutation codes are eliminated. We denote by $L_j (\subset L^1_j)$ the final ordered set of the leaders of $D^j_{Nj-1}$. At the end of the iterations on the dimensions, if certain leaders of $L^0$ are not used to compose leaders of $\{L_j\} j \in \{3, 4, 5, 7, 8, 9, 10, 12, 13, 14, 15\}$, the set $L'^0$ is updated by eliminating them. We write this set as $$L^0 = \underset{j \in [1,\ldots 15]}{Y} L^0_j.$$

The arrays of FIGS. 7c to 7e show the memory savings afforded by the embedding property and by the property of partial composition by controlled extension. The array of FIG. 7c compares vector quantizers with multiple resolutions for various dimensions: the first quantizers simply structured as unions of permutation codes, and the second quantizers possessing moreover the property of embedding by resolution.

In FIG. 7c, we write:

j: the dimension, $N_j$: the number of resolutions in dimension j, $$-L_{D^j_i}$$

: the number of leaders of the dictionary $D^j_i$, $L_{D^j}$: the number of leaders of the dictionary $D^j_{Nj-1}$, $$-j \sum_{i=1}^{N_{j-1}} L_{D^j_i}$$

: the memory (in number of words) required to store the leaders of all the dictionaries in dimension j without the embedding property, $jL_{D^j}$: the memory required to store the leaders of all the dictionaries in dimension j with the embedding property.

The array of FIG. 7d compares these latter quantizers, used for multiple dimensions, with quantizers also possessing the structuring property of partial composition by controlled extension.

In FIG. 7d, we write:

j: the dimension $L_{D^j}$: the number of leaders of the dictionary $D^j_{Nj-1}$, $$-\sum_{k=1}^{j} L_{Dk}$$

: the sum of the numbers of leaders of the dictionaries of maximal resolution of dimensions 1 to j, $$-\sum_{k=1}^{j} k L_{Dk}$$

the memory required to store these leaders without the property of partial composition by controlled extension, $L_j$: the number of leaders of the set $L^0_j$, $$-\sum_{k=1}^{j} L_k$$

$$-\sum_{k=1}^{j} k L_k$$

: their sum for the dimensions 1 to j,

: the memory required to store the leaders of all the dictionaries of dimensions 1 to j with the property of partial composition by controlled extension.

The array of FIG. 7e compares vector quantizers with multiple resolutions and dimensions: the first quantizers simply structured as a union of permutation codes and the second quantizers possessing moreover the structuring properties of embedding by resolution and of partial composition by controlled extension.

In FIG. 7e, we write:

j: the dimension $N_j$: the number of resolutions in dimension j $$-\sum_{i=1}^{Nj} L_{D_i^j}$$

: the number of leaders in dimension j to be stored for the $N_j$ resolutions without the property of embedding or the property of controlled partial extension $$-j\sum_{i=1}^{Nj} L_{D_i^j}$$

: the memory (in number of words) required to store these leaders of all the dictionaries in dimension j without these two properties $$-\sum_{k=1}^{j} k \sum_{i=1}^{N_k} L_{D_i^k}$$

: the memory (number of words) required to store the leaders of all the dictionaries of dimensions 1 to j without these two properties $L_j$: the number of leaders of the set $L^0_j$ $$-\sum_{k=1}^{j} L_k$$

$$-\sum_{k=1}^{j} k L_k$$

: their sum for dimensions 1 to j

: the memory required to store the leaders of all the dictionaries of dimensions 1 to j with the two properties of embedding and of partial composition by controlled extension.

In the three arrays, the last column shows the significance of the memory reduction factor. The embedding property alone makes it possible to reduce the memory by a factor of more than 3 in dimension 3, 5 in dimension 7, 7 in dimension 15. By virtue of the embedding property, instead of storing all the leaders of the $D^j_i$ for the set of resolutions in dimension j, we store only the leaders of $D^j_{Nj-1}$ (the leaders of $L_j$). The appending of the partial composition by controlled extension makes it possible to further reduce the memory as shown by the last column of the array of FIG. 7d. The additional saving afforded by this property is by a factor of greater than:

1.5 in dimension 4,
3 in dimension 8,
and 7 in dimension 15.

As shown by FIG. 7e, with respect to quantizers simply structured as a union of permutation codes, the use of quantizers possessing moreover the two structuring properties of embedding by resolution and of partial composition by controlled extension makes it possible to reduce the memory by a factor of 4 in dimension 3, 13 in dimension 7 and by a factor of greater than 35 for dimensions greater than 11.

With the property of partial composition by controlled extension, only the leaders of $L^0$ have to be stored, the leaders of the $\{L_j\}$ being retrieved from a correspondence table from the indices of the leaders of $L_j$ to the indices of the leaders of $L^0$.

We now describe how to effectively implement vector quantizers.

To implement a vector quantizer of dimension j and of resolution $r_i$, it is necessary to solve the following three problems:
search for the nearest neighbour of an input vector in $D^j_i$,
search for the index of a codevector of $D^j_i$,
and reciprocally, search for a codevector of $D^j_i$ on the basis of its index.

As far as indexation is concerned, it is indicated that there exists several known ways of indexing the codevectors of a dictionary, the union of permutation codes of type II. The numbering employed in the embodiment takes its inspiration from that used to index the spherical codes of the Gosset lattice.

For any dimension j(j∈{3, 4, 5, 7, 8, 9, 10, 12, 13, 14, 15}), each codevector of $D^j_{Nj-1}$ is indexed by an offset characteristic of its permutation code, of a binary index giving its combination of signs and of its rank in its permutation code. The offset of a permutation code is the aggregate of the cardinalities of the permutation codes preceding it in $D^j_{Nj-1}$. Among the formulae for numbering permutations, we have chosen the so-called Schalkwijk formula.

In addition to this conventional numbering of the codevectors of $D^j_{Nj-1}$, we use a correspondence table from the indices of the leaders of $L_j$ to the indices of the leaders of $L^0$. The leaders of $L^0$ being stored, great freedom of indexation of $L^0$ is thus available. For example, it is possible to class these leaders with nonzero integer components by increasing dimension. With each index $m^j$ of a leader $x^j$ of $L^j$ is associated an index $l_m$ of a leader $x^{j'}$, of $L^0$. On the basis of this index $l_m$, we retrieve the dimension j' of the leader $x^{j'}$ and the leader itself. The leader $x^j$ is then retrieved by inserting (j−j') zeros as last components of $x^{j'}$.

The array of FIG. 7f gives the first 23 leaders of $L^0$. The array of FIG. 7g gives the leaders of the permutation codes of the dictionaries in dimension 3 by indicating for each leader $x^3$, that leader $x^{j'}$ of $L^0_{j'}$, of dimension j'(j'≦j) that has been extended to obtain it. Incidentally, it is pointed out that if j=j', then $x^{j'}=x^3$.

In FIG. 7f, we write:

l the index of the leader in $L^0$ (from among the 516), j: its dimension, l': its index in the leaders of $L^0_j$.

In FIG. 7g, we write:

$m^3$: the index of the leader $x^3$ among the 23 leaders of $D^3_{N3}$, i: the index of the dictionary of smallest resolution to which the leader belongs (i.e. $x^3 \notin D^3_{i-1}$ and $x^3 \in D^3_i$), $jr_i$: the rate per vector of this dictionary $D^3_i$, j': the dimension of the leader $x^{j'\ of\ L0}$ (number of nonzero components), $l_m$: the index of $x^{j'}$ out of the 516 leaders of $L^0$.

Described hereinbelow are the coding and decoding algorithms proper in the general case and we shall see later the particularly advantageous case where an additional structural constraint (union of permutation codes) has been added.

It is firstly indicated that they preferentially utilize the dictionary structure induced in particular by the property of controlled extension which makes it possible to reduce the complexity of the nearest neighbour search algorithm. In particular, the codevectors having the same insertion rule can be grouped together. For example, in the case of a Euclidian distance distortion criterion which will be treated in detail later, if L codevectors $\{x^j_l, l=0, 1, \ldots, L-1\}$ of dimension j of a dictionary $D^j_i$ are obtained by the same insertion rule $R(n, \{(i_m,p_m)\}m=0,n-1)$ on the basis of L codevectors $x_1^{j-n}$ of dimension j-n of a dictionary $D_i^{j-n}$, the calculation of the L distances of the codevectors $x^j_l$ from an input vector y:Dist $$(y, x_l^j) = \sum_{k=0}^{j-1} (y_k - x_{k,l}^j)^2$$

may be accelerated by firstly calculating the term $$\sum_{m=0}^{n-1} (y_{pm} - a_{im})^2$$

then by calculating the L distances of the codevectors $x_1^{j-n}$ from the vector y' of dimension (j−n) obtained by raising to y the n components $y_{pm}$:

$$Dist(y', x_1^{j-n}) = \sum_{k=0}^{j-n-l} (y'_k - x_{k,l}^{j-n})^2.$$

As indicated hereinabove, for each dimension, only a part of the dictionary of maximal resolution needs to be stored, the other codevectors being deduced on the basis of elements taken from the dictionaries of maximal resolution of lower dimension and of insertion rules.

Hereinbelow is given a detailed exemplary embodiment of the compression coding/decoding in the use of the dictionary creation method according to the invention.

It is indicated firstly that instead of storing, for all the dimensions j to be considered, the set of all the dictionaries $\{D^j_1\}_{i=1,\ldots,Nj}$, we therefore store only the $$\{\overline{D^{rj}_{Nj}}\}$$

as well as correspondence tables. These tables make it possible to reconstitute a codevector of $D^j_{Nj}$ on the basis of its index. As described hereinabove, there are several ways of formulating these tables and hence of storing them. For example, we can, for all the dimensions j to be considered, tabulate for each index $m_j$ (of a codevector $x^j$ of $D^j_{Nj}$) three scalar integer values: j', m' and $l_r$, where $l_r$ is the number of the insertion rule which makes it possible to reconstitute $x^j$ by partial composition by controlled extension applied to the element of index m' of the set of $$\overline{D^{rj}_{Nj}}.$$

The correspondence tables now require only the storage of $$3\sum_{j=1}^{N} T^j_{Nj}$$

words (it is recalled that $T^j_i$ is the size of the dictionary $D^j_i$). As far as the storage proper of the dictionaries of a vector quantizer with multiple resolutions and dimensions is concerned, it requires $$\sum_{j=1}^{N} j \sum_{i=1}^{Nj} T^j_i$$

words in the case of a vector quantizer not possessing the two structuring properties of embedding by resolution and of partial composition by extension, whereas the storage of the dictionaries of a vector quantizer possessing these two structuring properties requires only one $$\sum_{j=1}^{N} j \overline{T^{rj}_{Nj}}$$

words, writing $$\overline{T^{rj}_{Nj}}$$

for the size of the set $$\overline{D^{rj}_{Nj}} (\overline{T^{rj}_{Nj}} \leq T^j_{Nj}).$$

However, in a general manner, $$\overline{T^{rj}_{Nj}}$$

is much smaller than $T^j_{Nj}$, since one is of course seeking to favor the set $D^{rj}_{Nj}$ with respect to the set $$\overline{D^{rj}_{Nj}}.$$

A few numerical examples of a saving of storage will be given in an embodiment described later.

The coding algorithm which consists in searching for the nearest neighbour $x^j$ in $D^j_i$ of an input vector $y=(y_0, \ldots, y_k, \ldots, y_{j-1})$ preferentially comprises the following steps:

The step C00) consists of an initialization step where we put:

$$d_{min}=VALMAX; m_{min}=-1; m^j=0$$

for every index $m^j \in [0, T^j_i[$:

The next step C01) consists of the reconstitution of the codevector $x^j$ of index $m^j$ and is preferentially performed as follows:

a) reading of the three indices j', m' and $l_r$ in the correspondence tables associated with $D^j_{Nj}$, b) reading in the set $$\overline{D^{'j'}_{Nj'}}$$

of the vector $x^{j'}$ of dimension j' and of index m', c) reconstitution of the codevector $x^j$ by application to $x^{j'}$ of the property of partial composition by controlled extension according to the rule of insertion of index $l_r$.

Step C02) consists in calculating the distance $d(y,x^j)$ between y and $x^j$ according to the chosen distortion criterion.

The next steps C03) and C04) consist in repeating operations C01) and C02) to identify the index of vector whose distance from the input vector is minimal. Thus:

if $d(y,x^j)<d_{min}$ then $d_{min}=d(y,x^j)$ and $m_{min}=m^j$ then, we increment $m^j$: $m^j=m^j+1$ an end test is provided:

if $m^j<T^j_i$ go to step C01), else: stop.

In the end step C05), we determine the codevector which is the nearest neighbour of the input vector y in the guise of codevector whose index $m_{min}$ has been identified in correspondence with the smallest distance $d_{min}$ with the input vector y.

Thus, the algorithm continues with step C05):

End the nearest neighbour $x^j$ of y in $D^j_i$ is the codevector of index $m_{min}$ The decoding algorithm which consists in searching for a codevector of $D^j_i$ on the basis of its index is given by step C01) of the coding algorithm. It is indicated, in particular, that the decoding involves the complete reconstitution of the codevector $x^j$ (operation c) of step C01)), regardless of the index to be decoded.

On the other hand, on coding, this reconstitution may be partial. Specifically, it may sometimes be omitted if the distortion criterion in the distance calculation of step C02) can be decomposed into two terms:

one dependent solely on the index of the insertion rule, and another the codevector $x^{j'}$.

For example, in the case of a Euclidean distance distortion criterion, it is possible, in the initialization step C00), to precalculate, for each insertion rule of index $l_r$ used in $D^j_i$, the distance $$d_{lr} = \sum_{m=0}^{j-j'-1} (y_{pm} - a_{im})^2$$

(if the insertion rule of index $l_r$ consists in inserting j–j' components $a_{im}$ at positions $p_m$, m ranging from 0 to j–j'–1). The calculation of the distance between y and the vector $x^j(j',m',l_r)$ of step C02) then amounts to calculating the distance:

$$d(y', x^{j'}) = \sum_{k=0}^{j'-1} (y'_k - x^{j'}_k)^2,$$

where $x^{j'}$ is the vector obtained in operation b) of step C01), and y' the vector of dimension j', obtained by raising to y the j–j' components $y_{pm}$, the distance $d(y,x^j)$ then being obtained by simple summation $d(y,x^j)=d_{lr}+d(y', x^{j'})$.

This is the reason for which we defined, hereinabove, as "partial" the reconstruction of a codevector $x^{j'}$ of lower dimension j' than the dimension j (which would be the dimension of a completely reconstructed codevector $x^j$), during the coding process.

Moreover, if a vector $x^{j'}$ intervenes several times in the composition of codevectors of $D^j_i$ (with various insertion rules), we can also precalculate in the initialization step, the terms $d(y',x^{j'})$. It is therefore seen that the compromise between storage (temporary)/complexity of the coding can be tailored according to the requirement of the application.

Likewise, the compromise between storage/complexity of indexation may also be tailored to the requirement of the application.

For coding, in the case of the additional constraint of a union of permutation codes as was mentioned above, the nearest neighbour search algorithm, for the spherical codes of the regular Gosset lattice in dimension 8, readily generalizes by simplifying to these dictionaries, by union of permutation codes of type II.

Such a search algorithm is described in particular in:

"Algorithme de Quantification Vectorielle Algébrique Sphérique par le Réseau de Gosset $E_8$", C. Lamblin, J. P. Adoul, Annales Des Télécommunications, no 3-4, 1988 ["Spherical algebraic vector quantization algorithm by the $E_8$ Gosset lattice"].

A first simplification is afforded by the "freedom" of the signs of the permutation codes of type II that are not possessed by the permutation codes of the Gosset lattice with odd components. A second simplification is afforded by the consideration of the number of nonzero components of each leader for the calculation of the scalar product. This illustrates the utilization of the structure induced by the property of partial composition by controlled extension by the coding algorithm. A last modification takes account of the storage in integer form of the leaders of $L^0$, thereby leading to the introduction into the calculation of the scalar product of a corrective factor equal to the inverse of the Euclidian norm of these leaders with strictly positive integer components.

Described hereinbelow is an embodiment in which the search for the nearest neighbour of an input vector y of dimension j in the dictionary $D_i^j$ utilizes, in addition to the two structuring properties of the invention, the aforesaid structure as a union of permutation codes.

Three additional steps are provided globally:

- two preliminary steps (before the reconstruction step CO1) hereinabove) for determining the absolute leader $|\tilde{y}|$ and the sign vector $\epsilon$ of the vector to be coded (steps CP1) and CP2)),
- and a last step for calculating the rank of its nearest neighbour in the dictionary (step CP5)).

The search described above is performed, no longer among the $T_i^j$ codevectors of $D_i^j$ (i.e. no longer for $m^j \in [0, T^j_i[$), but only over the set $L_j(i)$ of the $L_{Dji}$ leaders of $D_i^j$ (for $m^j \in [0,$ $$L_{D_i^j}$$

[, writing $$L_{D_i^j}$$

for the number of leaders or permutation codes of $D_i^j$).

In this embodiment, the search for the nearest neighbour of y in $D_i^j$ amounts to searching firstly for the nearest neighbour of $|\tilde{y}|$ in the set $L_j(i)$ (from among the $$L_{D_i^j}$$

first leaders of $L_j$). As described above, it is not necessary to completely reconstitute these leaders (operation c) of step CO1)), the distortion criterion (here the modified scalar product) being calculated only on the nonzero components of each leader. Therefore, for each leader it suffices to determine the corresponding leader in $L^0$ using the correspondence table from the indices of the leaders of $L_j$ to the indices of the leaders of $L^0$ associating with each index $m^j$ of a leader $x^j$ of $L_j$ an index $l_m$ of a leader $x^{j'}$ of $L^0$.

The algorithm then preferentially runs according to the following example:

step CP1):

Passage of the input vector $y=(y_0, \ldots, y_k, \ldots, y_{j-1})$ to its absolute vector $|y|=(|y_0|, \ldots, |y_k|, \ldots, |y_{j-1}|)$ and to its sign vector $\epsilon=(\epsilon_0, \ldots, \epsilon_k, \ldots, \epsilon_{j-1})$ with $\epsilon_k=1$ if $y_k \geq 0$ and $\epsilon_k=-1$ else.

Step CP2):
Search for the leader $|\tilde{y}|$ of $|y|$ by permutation of its components so as to arrange them in decreasing order
Step CP3):
Step Co0'): Initialization:

$$ps_{max}=-1.; m_{max}=-1; m^j=0$$

for every index $m^j[0,$ $$L_{D_i^j}[$$

Step CO1'): reconstruction of the leader of index $m^j$;
a) reading of the index $l_m$ of the leader $x^{j'}$ associated with the leader of index $m^j$ of $L_j$, in the correspondence table associating the leaders of $L_j$ with those of $L^0$, then determination of the dimension j' of the leader $x^{j'}$ and reading of the corrective factor $\alpha$ (with $$\frac{1}{\alpha} = \sqrt{\sum_{k=0}^{j'-1} (x_k^{j'})^2}$$

b) Reading in the set $L^0$ of the leader $x^{j'}$ of dimension j' and of index $l_m$.
Step CO2') Calculation of the modified scalar product between $|\tilde{y}|$ and $x^{j'}$:

$$ps(|\tilde{y}|, x^{j'}) \alpha \sum_{k=0}^{j'-1} (|\tilde{y}_k| \cdot x_k^{j'})$$

The next steps consist in repeating the operations CO1') and CO2') to identify the index of the code leader whose modified scalar product with the absolute leader of the input vector is maximal. Thus:

if ps $(|\tilde{y}|,x^{j'})>ps_{max}$ then $ps_{max}=ps(|\tilde{y}|,x^{j'})$ and $m_{max}=m^j$
next, we increment $m^j$: $m^j=m^j+1$
end test
if $$m^j < L_{D_i^j}$$

go to step CO1'), else stop,

At this end step, we calculate the index of the nearest neighbour of y in $D^j_i$ by the procedure of indexation of a union of permutation codes on the basis of the number of the permutation code $m_{max}$ found in step CP3), of the rank of the permutation performed in step CP2) and of the sign vector determined in step CP1).

It should be noted that step CP2) may be accelerated. Specifically, if $n_i^j$ is the maximum number of nonzero components of the leaders of $L_j(i)$, it suffices to search for the $n_i^j$ largest components of $|y|$. There are several variants of step CP3) depending on the storage/complexity compromise desired. If one wishes to minimize the number of calculations, we can tabulate for all the leaders of $L^0$ simply their dimension j' and their corrective factor. The determination of the dimension j' mentioned in step CP3) consists in this case in reading the correspondence table. Conversely, if one wishes rather to reduce the memory, this determination is carried out on the basis of the index $l_m$. Likewise, the corrective factor may be calculated after the reading of the leader $x^{j'}$.

Thus, the algorithm for searching for the nearest neighbour of an input vector y of dimension j in the dictionary $D_i^j$, using a structure as a union of permutation codes, may be preferentially summarized as follows: CP1) we pass from the input vector $y=(y_0, \ldots, y_k, \ldots, y_{j-1})$ to its absolute vector $|y|=(|y_0|, \ldots, |y_k|, \ldots, |y_{j-1}|)$ and to its sign vector $\epsilon=(\epsilon_0, \ldots, \epsilon_k, \ldots, \epsilon_{j-1})$ with $\epsilon_k=1$ if $y_k \geqq 0$ and $\epsilon_k=-1$ else, CP2) we search for the leader $|\tilde{y}|$ of $|y|$ by permuting its components so as to arrange them in decreasing order, CP3) we search for the nearest neighbour of $|\tilde{y}|$ in the set $L_j(i)$ of the leaders of $D_i^j$ (in fact from among the $M_i^j$ first leaders of $L_j$ by writing $M_i^j$ for the number of permutation codes of $D_i^j$). As indicated above, this step amounts to searching for the leader of $L^0$ which maximizes the modified scalar product among the list of the $M_i^j$ leaders of $L^0$ indicated by the correspondence table from the indices of the leaders of $L_j$ to the indices of the leaders of $L^0$. If the dimension of a leader $x^{j'}$ of $L^0$ is j'(j'≧j), the calculation of its scalar product with $|\tilde{y}|$ is performed only on the first j' components of $|\tilde{y}|$, then multiplied by the inverse of the Euclidian norm of $x^{j'}$.

CP4) and we calculate the index of the rank of this nearest neighbour of y in $D_i^j$ by the procedure of indexation of a union of permutation codes on the basis of the number of the permutation code found in the previous step, of the rank of the permutation performed in step CP2) and of the sign vector determined in step CP1).

In short, step CP2) may be accelerated. Specifically, if $n_i^j$ is the maximum number of nonzero components of the leaders of $L_j(i)$, it suffices to search for the $n_i^j$ largest components of $|y|$.

We now describe a decoding algorithm, within the general sense, without necessarily using limitatively a permutation codes union indexation described above as advantageous embodiment. The decoding algorithm preferentially takes the following form.

On the basis of an index $m_j$ received, we determine whether this index corresponds to a codevector belonging to $$\overline{D'^j_{Nj-1}}$$

or to $D'^{j}_{Nj-1}$.

In the first case, $m_j$ is associated with a unique index in $$\overline{D'^j_{Nj-1}},$$

and the codevector is obtained through simple reading of correspondence table.

In the second case, $m_j$ points to an element $$\overline{D'^j_{Nj'-1}}(j' < j)$$

and to an insertion rule.

The determination of whether $x^j_{mj}$ belongs to $D'^v_{Nj-1}$ or to its complement may be performed in various ways. For example, it is possible to use a binary indication for each index. It is also possible, for each resolution $r_i$, to index the elements of the complement $D'^j_{i-1}$ in $D'^j_i$, beginning with the elements obtained by controlled extension belonging to $D'^v_i$, followed by the "free" elements belonging to $$\overline{D'^j_i}.$$

Membership in $D'^v_{Nj-1}$ or in $$\overline{D'^j_{Nj-1}}$$

is then undertaken through simple tests. Likewise, the insertion rule may be explicitly indexed or otherwise.

For example, in the embodiments described below, the insertion rule is implicitly retrieved on the basis of the index. It will also be understood that the storage/indexation complexity compromise may be tailored as a function of the requirements of the application.

We return here to the particular case of the additional constraint defined by the union of permutation codes. Preferentially, the decoding algorithm takes its inspiration from the document:

"Algorithme de Quantification Vectorielle Algébrique Sphérique par le Réseau de Gosset $E_8$", C. Lamblin, J. P. Adoul, Annales Des Télécommunications, No. 3-4, 1988, using in addition the correspondence table from the indices of leaders of $L_j$ to those of $L^0$.

On the basis of the index of a codevector in $D'^j_i$, we determine the index of its leader in $L_j(i)$, its rank in its permutation code and the sign of its nonzero components. The correspondence table then gives the index of the leader in $L^0$ which is then obtained through simple reading of a table stored in memory as well as its normalization factor which makes it possible to normalize the decoded codevector.

Another exemplary implementation of the present invention is given below. This example is also based on the TDAC type transform based coder, but for a use to code digital audio signals sampled at 32 kHz and of bandwidth 15 kHz (FM band), contrary to the example given above of the use of the TDAC coder in wideband to code digital audio signals sampled at 16 kHz.

The principle of this coder is similar to that of the TDAC wideband coder at 16 kHz. The audio signal, band limited at 16 kHz and now sampled at 32 kHz, is also split into frames of 20 ms. This leads after MDCT transformation to the obtaining of 640 coefficients. The spectrum is split into 52 bands of unequal widths, the splitting of the wide band being identical to the splitting performed by the wideband TDAC coder.

The array of FIG. 8a gives the band splitting used and the resulting dimension of the vector of coefficients (corresponding to the number of coefficients indicated in the third column).

The quantization of the spectral envelope also uses a Huffman coding and the remaining variable rate is allocated dynamically to the coefficients on the basis of the dequantized version of this spectral envelope.

The quantization of the MDCT coefficients uses dictionaries constructed according to the invention. As in the case described previously, the dictionaries are also structured as a union of permutation codes. For dimensions lower than 15, vector quantizers are the same as those of the wideband. Thus, we construct dictionaries for dimensions 16, 17, 18, 19, 20 and 24. For dimension 24, this structure has moreover been combined with the Cartesian product structure. The last top band of 24 coefficients is split into two vectors of dimension 12: one is made up of the even coefficients, the other of the odd coefficients. Here, the vector quantizers constructed for dimension 12 have been utilized.

The array of FIG. 8b gives the number of different resolutions as well as their values for dimensions 1 to 24.

The present invention thus provides an effective solution to the problem of vector quantization at variable rate and variable dimension. The invention jointly solves the two problems of variable resolution and variable dimension by providing a vector quantizer whose dictionaries, for the various dimensions and resolutions, possess the structuring properties PR and PD hereinabove.

For a given dimension, the embedding of the dictionaries guarantees, on the one hand, the local decreasing of the distortion as a function of resolution and reduces, on the other hand, notably the quantity of memory required for storage since the dictionaries of lower resolutions do not have to be stored, all the elements of these dictionaries in fact being in the dictionary of maximal resolution. As compared with the vector quantizer structured as a tree of FIGS. 1a and 1b, the choice to embed the dictionaries therefore already affords two advantages: the assurance of a decrease in local distortion as a function of increasing resolutions and reduced storage. It also allows great fineness of resolution with, if necessary, a granularity of less than a bit, facilitating the choice of dictionaries of sizes that are not necessarily equal to powers of 2. This fine granularity of the resolutions is particularly beneficial if several vectors of variable dimension and/or variable resolution are to be quantized per frame, by associating an algorithm for arranging the indices as a binary train with these noninteger vector based rate quantizers.

The embedding property PR of the dictionaries implies that it is only necessary to store the dictionaries of maximal resolution. By virtue of the second property PD, the quantity of storage memory is even more reduced. Specifically, part of the elements of the dictionaries of maximal resolution does not need to be stored since it is deduced from elements taken from the dictionaries of maximal resolution but of lower dimension, taking account of predefined insertion rules $\{R_m\}$. The proportion of elements thus structured is readily adaptable and makes it possible to finely tailor the quantity of storage memory.

The structure induced by these two properties PR and PD therefore makes it possible to advantageously reduce the storage memory required. It may obviously be more so by imposing additional structural constraints on the dictionaries, such as those already mentioned in the introductory part with reference to the prior art hereinabove. In preferred embodiments, there is provision for example for the use of spherical vector quantizers, the union of permutation codes, combined as appropriate with the Cartesian product structure described hereinabove.

As compared with algebraic vector quantizers, this structure of dictionaries that is induced by the two properties offers very great flexibility of design both in respect of choice of dimensions and in respect of choice of resolutions. Moreover, these vector quantizers adapt to the statistic of the source to be coded and thus avoid the problem of the tricky design of a "vector companding" that is obligatory in algebraic vector quantization so that the distribution of the source to be coded is rendered uniform.

The invention claimed is:

1. A computer system for coding and decoding digital signals by vector quantization at variable rate defining a variable resolution, comprising:
a computer readable medium storing a dictionary comprising:
codevectors of variable dimension; and
inter-embedded sub-dictionaries of increasing resolution of a given dimension, wherein each sub-dictionary comprises a union of a) a first set consisting of codevectors constructed by inserting, into codevectors of dictionaries of lower dimension, elements taken from a finite set of real numbers according to a finite collection of predetermined insertion rules, and of b) a second set consisting of codevectors that may not be obtained by insertion into codevectors of lower dimension of the elements of said finite set according to said collection of insertion rules.

2. The computer readable medium as claimed in claim 1, wherein said collection of insertion rules is formulated on the basis of elementary rules consisting of inserting a single element of the finite set of real numbers in the guise of a component at a given position of a vector.

3. The computer readable medium as claimed in claim 2, wherein each elementary rule is defined by a pair of two positive integers representative of a rank of the element in said finite set, and of a position of insertion.

4. A method for operating a coding-decoding device having a processor by vector quantization at variable rate defining a variable resolution, comprising:
forming, using the processor, a dictionary comprising codevectors of variable dimension in which, for a given dimension, the method comprises:
a) forming a first set consisting of codevectors by performing an operation selected from the group consisting of inserting into and deleting from codevectors of dictionaries of dimension elements comprising at least one of lower and higher dimension elements taken from a finite set of real numbers according to a finite collection of predetermined operation rules selected from the group consisting of insertion rules and deletion rules,
b) constructing a first, intermediate, dictionary comprising at least said first set, for said given dimension, and
c) adapting said dictionary for use with at least one given resolution, wherein a second, definitive, dictionary is constructed, on the basis of the intermediate dictionary, by performing at least one of embedding and simplification of dictionaries of at least one of increasing and decreasing resolutions, the dictionaries of increasing resolutions being inter-embedded from the dictionary of smallest resolution up to the dictionary of greatest resolution.

5. The method as claimed in claim 4, in which, for a given dimension N, the method further comprising:
a0) obtaining an initial dictionary of initial dimension n, lower than said given dimension N,
a1) forming a first set consisting of codevectors of dimension n+i, where i is a non negative integer, by inserting into codevectors of the initial dictionary elements taken from a finite set of real numbers according to a finite collection of predetermined insertion rules,
a2) providing a second set consisting of codevectors of dimension n+i that may not be obtained by insertion into the codevectors of the initial dictionary of the elements of said finite set with said collection of insertion rules,
a3) constructing an intermediate dictionary, of dimension n+i comprising a union of said first set and of said second set, and
a4) repeating steps a1) to a3) at most N−n−1 times, with said intermediate dictionary in the guise of initial dictionary, up to said given dimension N.

6. The method as claimed in claim 5, in which N successive dictionaries of respective dimensions 1 to N are obtained on the basis of an initial dictionary of dimension p, through the repeated implementation of steps a1) to a3) for the dimensions p+1 to N, and through a repeated implementation of steps a'1) to a'3) that follow for the dimensions p−1 to 1:
   a'1) constructing a first set, of dimension n−i, where i is a non negative integer, by selecting and extracting of possible codevectors of dimension n−i from the dictionary of dimension n, according to a finite collection of predetermined deletion rules,
   a'2) providing a second set consisting of codevectors of dimension n−i, that may not be obtained by deletion, from the codevectors of the initial dictionary, of the elements of said finite set with said collection of deletion rules, and
   a'3) constructing an intermediate dictionary, of dimension n−i comprising a union of said first set and of said second set.

7. The method as claimed in claim 4, in which said collection of operation rules is formulated on the basis of elementary rules consisting of performing the operation on a single element of the finite set of real numbers in the guise of component at a given position of a vector.

8. The method as claimed in claim 7, in which each elementary rule is defined by a pair of two positive integers representative of a rank of the element in said finite set, and of a position of the operation.

9. The method as claimed in claim 4, in which said finite set and said collection of operation rules are defined a priori, before constructing the dictionary by analysis of a source to be quantized.

10. The method as claimed in claim 9, in which said source is modeled by a learning sequence and the definition of said finite set and of said collection of operation rules is effected by statistical analysis of said source.

11. The method as claimed in claim 9, in which said finite set is chosen by estimation of a mono-dimensional probability density of said source.

12. The method as claimed in claim 9, in which:
   a first set and a first collection of operation rules are chosen a priori by analysis of a learning sequence, so as to form one or more intermediate dictionaries,
   at least one part of at least one of said first set and of said first collection of operation rules is updated by a posteriori analysis of said one or more intermediate dictionaries,
   and, as appropriate, at least one part of the set of codevectors forming said one or more intermediate dictionaries is also updated.

13. The method as claimed in claim 4, in which said finite set and said collection of operation rules are defined a posteriori after construction of dictionaries by performing at least one of embedding and simplification of dictionaries of successive resolutions, followed by a statistical analysis of these dictionaries thus constructed.

14. The method as claimed in claim 13, further comprising:
   choosing, a priori, a first set and a first collection of operation rules by analysis of a learning sequence, so as to form one or more intermediate dictionaries,
   updating at least one part of said first set and/or of said first collection of operation rules by a posteriori analysis of said one or more intermediate dictionaries,
   and, as appropriate, also updating at least one part of the set of codevectors forming said one or more intermediate dictionaries.

15. The method as claimed in claim 4, in which step c) comprises:
   c'0) obtaining an initial dictionary of initial resolution $r_n$, higher than said given resolution $r_N$,
   c'1) constructing, on the basis of the initial dictionary, an intermediate dictionary of resolution $r_{n-1}$ lower than the initial resolution $r_n$, by partitioning of the initial dictionary into several subsets ordered according to a predetermined criterion, and
   c'2) repeating step c'1) until the given resolution $r_N$ is attained.

16. The method as claimed in claim 15, in which said predetermined criterion is chosen from among the cardinal of the subsets, an invoking of the subsets in a learning sequence, a contribution of the subsets to a total distortion or preferably to a decrease of this distortion.

17. The method as claimed in claim 15, in which said partition uses part at least of said operation rules.

18. A method for operating a coding-decoding device having a processor, comprising:
   forming, using the processor, a dictionary comprising codevectors of variable dimension in which, for a given dimension N of codevectors, the method comprises:
   constructing a first, intermediate, dictionary still of dimension N' but of at least one of higher and lower resolution $r_N$ on the basis of an initial dictionary of resolution $r_n$ and of dimension N' by performing at least one of embedding and simplification of dictionaries of at least one of increasing and decreasing resolutions, so as to substantially attain the resolution $r_N$ of said first dictionary,
   forming, to attain the given dimension N, a first set consisting of codevectors by performing an operation selected from the group consisting of inserting into and deleting from codevectors of the first dictionary of dimension N' at least one of lower and higher than said given dimension N elements taken from a finite set of real numbers according to a finite collection of predetermined operation rules is constructed,
   and subsequent to a possible step of definitive adaptation to the resolution $r_N$, constructing a second, definitive, dictionary comprising at least said first set for said given dimension N.

19. The method as claimed in claim 4, further comprising storing in a memory said collection of operation rules, each identified by an index ($l_r$), and, for a given dimension:
   said second set consisting of codevectors that may not be obtained by application of the operation to codevectors of at least one of lower and higher dimension than the given dimension according to said collection of operation rules,
   as well as at least one correspondence table making it possible to reconstitute any codevector of the dictionary of given dimension, using the indices of the operation rules and indices identifying elements of said second set,
   thereby making it possible to avoid the complete storage of the dictionary for said given dimension, by simply storing the elements of said second set and links in the correspondence table for access to these elements and to the associated operation rules.

20. The method as claimed in claim 19, in which the correspondence tables are formulated previously, for each index ($m^j$) of a codevector ($x^j$) of the dictionary ($D^j_{Nj}$) of given dimension (j) that may be reconstructed on the basis of elements of current indices (m') in the second set of current dimension (j'), through a tabulation of three integer scalar values representing:
- a current dimension (j') of said second set,
- a current index (m') of an element of the second set, and
- an operation rule index ($l_r$), this operation rule at least contributing to reconstitute said codevector ($x_j$) of the dictionary ($D^j_{Nj}$) of given dimension (j), by applying the insertion/deletion to the element of said current index (m') and of said current dimension (j').

21. A method for operating a coding-decoding device having a processor by vector quantization at variable rate defining a variable resolution, comprising:
   forming, using the processor, a dictionary comprising codevectors of variable dimension and, in which, for a given dimension:
   a) forming a first set consisting of codevectors by performing an operation selected from the group consisting of inserting into and deleting from codevectors of dictionaries of dimension elements comprising at least one of lower and higher dimension elements taken from a finite set of real numbers according to a finite collection of predetermined operation rules,
   b) constructing a first, intermediate, dictionary comprising at least said first set said given dimension,
   c) adapting said dictionary for a use with at least one given resolution, wherein a second, definitive, dictionary is constructed, on the basis of the intermediate dictionary, by performing at least one of embedding and simplification of dictionaries of at least one of increasing and decreasing resolutions, the dictionaries of increasing resolutions being inter-embedded from the dictionary of smallest resolution up to the dictionary of greatest resolution;
   in which, for a given dimension N:
   a'0) obtaining an initial dictionary of initial dimension n, higher than said given dimension N,
   a'1) constructing a first set, of dimension n−i, where i is a non negative integer, by selecting and extracting of possible codevectors of dimension n−i from the dictionary of dimension n, according to a finite collection of predetermined deletion rules,
   a'2) providing a second set consisting of codevectors of dimension n−i, that may not be obtained by deletion, from the codevectors of the initial dictionary, of the elements of said finite set with said collection of deletion rules,
   a'3) constructing an intermediate dictionary, of dimension n−i comprising a union of said first set and of said second set, and
   a'4) repeating steps a'1) to a'3) at most n−N−1 times, with said intermediate dictionary in the guise of initial dictionary, down to said given dimension N.

22. A method for operating a coding-decoding device having a processor by vector quantization at variable rate defining a variable resolution, comprising:
   forming, using the processor, a dictionary comprising codevectors of variable dimension in which, for a given dimension, the method comprising:
   a) forming a first set consisting of codevectors by performing an operation selected from the group consisting of inserting into and deleting from codevectors of dictionaries of dimension elements comprising at least one of lower and higher dimension elements taken from a finite set of real numbers according to a finite collection of predetermined operation rules,
   b) constructing a first, intermediate, dictionary comprising at least said first set, for said given dimension, and
   c) adapting said dictionary to a use with at least one given resolution, wherein a second, definitive, dictionary is constructed, on the basis of the intermediate dictionary, by performing at least one of embedding and simplification of dictionaries of at least one of increasing and decreasing resolutions, the dictionaries of increasing resolutions being inter-embedded from the dictionary of smallest resolution up to the dictionary of greatest resolution; wherein
   step c) further comprises:
   c0) obtaining an initial dictionary of initial resolution $r_n$, lower than said given resolution $r_N$,
   c1) constructing on the basis of the initial dictionary, an intermediate dictionary of resolution $r_{n+1}$ higher than the initial resolution $r_n$, and
   c2) repeating step c1) until the given resolution $r_N$ is attained.

23. The method as claimed in claim 22, in which, for each iteration of operation c1), there is provided a construction of classes and of centroids, in which the centroids belonging at least to the dictionaries of resolution higher than a current resolution $r_i$ are recalculated and updated.

24. The method as claimed in claim 23, in which the centroids which belong to the dictionaries of resolution lower than a current resolution $r_i$ are updated only if the total distortions of all the dictionaries of lower resolution are decreasing from one update to the next.

25. The method as claimed in claim 22, in which N successive dictionaries of respective resolutions $r_1$ to $r_N$ are obtained on the basis of an initial dictionary of intermediate resolution $r_n$, by the repeated implementation of step c1) for the increasing resolutions $r_{n+1}$ to $r_N$, and through a repeated implementation of step c'1) that follows for the decreasing resolutions $r_{n-1}$ to $r_1$:
   c'1) constructing, on the basis of the initial dictionary, an intermediate dictionary of resolution $r_{n-1}$ lower than the initial resolution $r_n$, by partitioning of the initial dictionary into several subsets ordered according to a predetermined criterion.

26. A method for operating a compression coding-decoding device having a processor, comprising:
   searching for a codevector ($x^j$) which is the nearest neighbour of an input vector $y=(y_0, \ldots, y_k, \ldots, y_{j-1})$ in a dictionary ($D^i_j$) of given dimension (j),
   reconstituting, using the processor, said codevectors by using at least one correspondence table making it possible to reconstitute any codevector of the dictionary of said given dimension, using indices of a collection of operation rules selected from the group consisting of insertion rules and deletion rules and indices identifying elements of a set of codevectors that may not be obtained by application of the operation to codevectors of at least one of lower and higher dimension than the given dimension according to said collection of operation rules,
   CO1) reconstituting, for a current index ($m^j$) of said codevector ($x^j$) sought, at least partial of a codevector of index (m') corresponding to said current index ($m^j$), at least through the prior reading of the indices (j', m', $l_r$) appearing in the correspondence tables making it possible to formulate said dictionary,
   CO2) calculating at least on coding, a distance between the input vector and the codevector reconstituted in step CO1),
   CO3) repeating steps CO1) and CO2), at least on coding, for all the current indices in said dictionary,
   CO4) identifying, at least on coding, of the index ($m_{min}$) of the codevector at least partially reconstituted whose distance ($d_{min}$), calculated in the course of one of the iterations of step CO2), with the input vector is the smallest, and CO5) determining at least on decoding, of the nearest neighbour of the input vector (y) in the guise of codevector ($x^j$) whose index ($m_{min}$) has been identified in step CO4).

27. The method as claimed in claim 26, in which step CO1), at least on decoding, comprises:
CO11) reading, in the correspondence tables, indices representative of links to said second set and the operation rules and including:
the index of a current dimension of a subset of said second set,
the current index of an element of said subset,
and the index of the appropriate operation rule for the construction of the codevector of the dictionary of given dimension, on the basis of said element,
CO12) reading, from the subset identified by its current dimension, of said element identified by its current index,
CO13) reconstructing the codevector to said given dimension by applying to said element read in step CO12) the appropriate operation rule identified by its index read in step CO11).

28. The method as claimed in claim 26, in which, on coding, step CO1) comprises:
CO11) reading, from the correspondence tables, indices representative of links to said second set and to the operation rules and including:
the index of a current dimension of a subset of said second set,
the current index of an element of said subset,
and the index of the appropriate operation rule for the construction of the codevector of the dictionary of given dimension,
CO12) reading, from the subset identified by its current dimension, of said element identified by its current index, wherein, in step CO2), said distance is calculated as a function of a distortion criterion estimated as a function of:
the index of the operation rule,
and of the element of the subset identified by its current index, thereby making it possible to only partially construct the codevector with said given dimension in step CO1), by reserving the complete reconstruction simply for decoding.

29. The method as claimed in claim 26, in which there is provided furthermore a supplementary structuring property according to a union of permutation codes and utilizing an index of said union of permutation codes, and in which:
CP1) on the basis of an input signal, an input vector $y = (y_0, \ldots, y_k, \ldots, y_{j-1})$ defined by its absolute vector $|y| = (|y_0|, \ldots, |y_k|, \ldots, |y_{j-1}|)$ and by a sign vector $\epsilon\gamma$ ($\epsilon_0, \ldots, \epsilon_k, \ldots, \epsilon_{j-1}$) with $\epsilon_k = \pm 1$ is formed,
CP2) the components of the vector $|y|$ are ranked by decreasing values, by permutation, to obtain a leader vector $|\tilde{y}|$,
CP3) a nearest neighbour $x^{j'}$ of the leader vector $|\tilde{y}|$ is determined from among the leaders of the dictionary $D'_i$ of dimension j,
CP4) an index of the rank of said nearest neighbour $x^{j'}$ in the dictionary $D'_i$ is determined,
CP5) and an effective value of at least one of coding and decoding is applied to the input vector, which is dependent on said index determined in step CP4), on said permutation determined in step CP2) and on said sign vector determined in step CP1).

30. The method as claimed in claim 26, in which at least said correspondence tables are stored in a memory of at least one of coding and decoding devices.

31. A computer readable memory storing a computer program product intended to be stored in a memory of a processing unit, in particular of a computer or of a mobile terminal, or on a removable memory medium and intended to cooperate with a reader of the processing unit, wherein it comprises instructions for implementing the method according to claim 4.

32. A computer readable memory storing a computer program product intended to be stored in a memory of a processing unit, in particular of a computer or of a mobile terminal integrating at least one of coding and decoding device, or on a removable memory medium and intended to cooperate with a reader of the processing unit,
wherein it comprises instructions for implementing the method according to claim 26.

* * * * *

UNITED STATES PATENT AND TRADEMARK OFFICE
CERTIFICATE OF CORRECTION

PATENT NO. : 7,680,670 B2  
APPLICATION NO. : 10/587907  
DATED : March 16, 2010  
INVENTOR(S) : Claude Lamblin et al.

Page 1 of 2

It is certified that error appears in the above-identified patent and that said Letters Patent is hereby corrected as shown below:

IN THE ABSTRACT:

In line 6, "D'i<N>" should read -- $D'^N_i$ --

IN THE SPECIFICATION:

In Column 4, line 11, "Thoeretically" should read -- Theoretically --

In Column 13, line 17, "$|\tilde{j}|$" should read -- $|\tilde{y}|$ --

In Column 16, line 10, "$(T^j_i - R_{i-1}^j)$" should read -- $(T^j_i - T_{i-1}^j)$ --

In Column 22, line 4, "$S^1 = \{S^1_j\} j \in [3,4,5,6,8,10,12,13,14,15]$" should read -- $S^1 = \{S^1_j\} j \in [3,4,5,7,8,9,10,12,13,14,15]$ --

In Column 22, line 50, should read --
$$L'^0 = \bigcup_{j \in [1,...15]} L'^0_j$$
--

In Column 23, line 57, should read --
$$L^0 = \bigcup_{j \in [1,...15]} L^0_j$$
--

In Column 24, lines 55-67, should read

-- $\sum_{k=1}^{j} L_k$ : their sum for the dimensions 1 to j, $\sum_{k=1}^{j} kL_k$ : the memory required to store the leaders of all the dictionaries of dimensions 1 to j with the property of partial composition by controlled extension. --

Signed and Sealed this

Nineteenth Day of October, 2010

David J. Kappos  
*Director of the United States Patent and Trademark Office*

CERTIFICATE OF CORRECTION (continued)
U.S. Pat. No. 7,680,670 B2

IN THE SPECIFICATION:

In Column 25, lines 45-56 should read

-- $\sum_{k=1}^{j} L_k$ : their sum for dimensions 1 to j $\sum_{k=1}^{j} kL_k$ : the memory required to store the leaders of all the dictionaries of dimensions 1 to j with the two properties of embedding and of partial composition by controlled extension. --

In Column 26, line 66, " $x^3 \notin D3_{i-1}$ " should read -- $x^3 \notin D^3_{i-1}$ --

In Column 27, line 1, "$x^{j'\ of\ L0}$" should read -- $x^{j'}$ of $L^0$ --

In Column 31, lines 19-30 should read

-- only over the set $L_j(i)$ of the $L_{Dji}$ leaders of $D_i^j$ (for $m^j \in [0, L_{D_i^j}[$, writing $L_{D_i^j}$ --

In Column 32, lines 8-12 should read

-- for every index $m^j \in [0, L_{D_i^j}[$ --

In Column 32, line 34 should read $$ps(|\tilde{y}|,x^{j'})=\alpha\sum_{k=0}^{j'-1}(|\tilde{y}_k|\cdot x_k^{j'})$$

In Column 33, line 21, "j'(j'≧j)" should read -- j'(j'≤j) --

IN THE CLAIMS:

In Claim 29, Column 42, line 11, "εγ" should read -- ε = --